United States Patent
Hung et al.

(10) Patent No.: US 8,816,565 B2
(45) Date of Patent: Aug. 26, 2014

(54) TWO-DIMENSIONAL COMB-DRIVE ACTUATOR AND MANUFACTURING METHOD THEREOF

(75) Inventors: Chang-li Hung, Taipei (TW); Ta-wei Lin, Taipei (TW)

(73) Assignee: Opus Microsystems Corporation, Taipei (TW)

( * ) Notice: Subject to any disclaimer, the term of this patent is extended or adjusted under 35 U.S.C. 154(b) by 544 days.

(21) Appl. No.: 13/115,092

(22) Filed: May 24, 2011

(65) Prior Publication Data

US 2011/0309717 A1   Dec. 22, 2011

(30) Foreign Application Priority Data

Jun. 18, 2010   (TW) .............................. 099119966 A

(51) Int. Cl.
*H02N 1/00* (2006.01)
*H01L 21/02* (2006.01)

(52) U.S. Cl.
CPC .............. *H02N 1/002* (2013.01); *H02N 1/006* (2013.01); *H02N 1/008* (2013.01); *H02N 1/00* (2013.01); *H01L 21/02* (2013.01)
USPC ............ 310/309; 310/10; 310/12.03; 310/36; 310/300

(58) Field of Classification Search
CPC ......... H02N 1/00; H02N 1/002; H02N 1/006; H02N 1/008; H01L 21/02
USPC ............................ 310/10, 12.03, 36, 300, 309
IPC ......................................................... H02N 1/00
See application file for complete search history.

(56) References Cited

U.S. PATENT DOCUMENTS

| | | | | |
|---|---|---|---|---|
| 5,801,472 | A * | 9/1998 | Wada et al. .................... | 310/309 |
| 7,550,895 | B2 * | 6/2009 | Tsuboi et al. ................. | 310/309 |
| 7,872,394 | B1 * | 1/2011 | Gritters et al. ................ | 310/309 |
| 8,546,995 | B2 * | 10/2013 | Hung et al. .................... | 310/309 |
| 2004/0119376 | A1 * | 6/2004 | Chou et al. .................... | 310/309 |
| 2005/0035682 | A1 * | 2/2005 | Tsuboi et al. ................. | 310/309 |
| 2006/0152106 | A1 * | 7/2006 | Yan et al. ...................... | 310/309 |
| 2006/0268383 | A1 * | 11/2006 | Cho et al. ...................... | 359/223 |
| 2006/0284514 | A1 * | 12/2006 | Ko et al. ........................ | 310/309 |
| 2008/0054758 | A1 * | 3/2008 | Tsuboi et al. ................. | 310/309 |
| 2010/0309717 | A1 * | 12/2010 | Wang et al. ................... | 365/163 |
| 2011/0309717 | A1 * | 12/2011 | Hung et al. .................... | 310/300 |

* cited by examiner

*Primary Examiner* — John K Kim

(57) ABSTRACT

A two-dimensional comb-drive actuator and manufacturing method thereof are described. The two-dimensional comb-drive actuator includes a supporting base, a frame and a movable body. The supporting base has first comb electrodes and the frame has internal comb electrodes and external comb electrodes. The external comb electrodes of the frame are interdigitated to the first comb electrodes of the supporting base. The movable body has second comb electrodes which are interdigitated to the internal comb electrodes of the frame. The thicknesses of the second comb electrodes of the movable body are unequal to the internal comb electrodes of the frame and the external comb electrodes of the frame are unequal to the first comb electrodes of the supporting base. The two-dimensional comb-drive actuator utilizes a conducting layer for the above-mentioned comb electrodes in order to increase the rotation angle and operation frequency thereof.

23 Claims, 20 Drawing Sheets

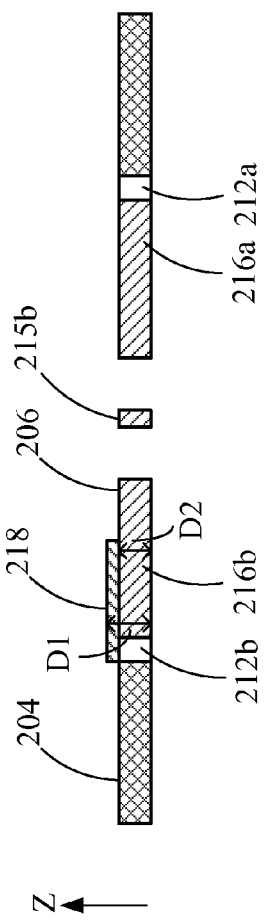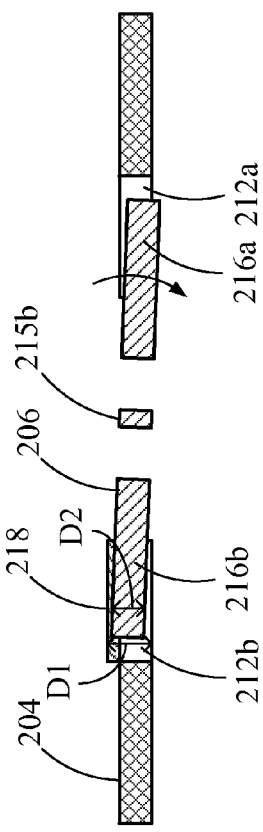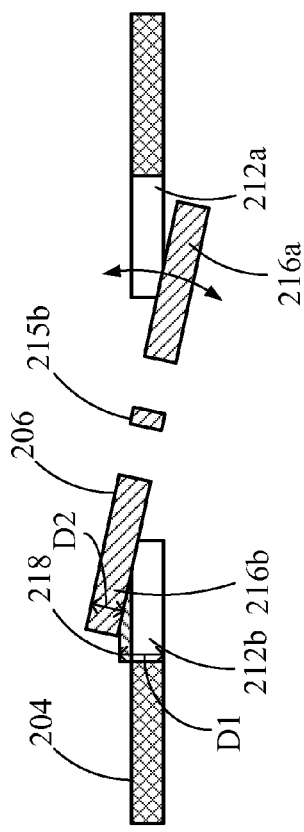

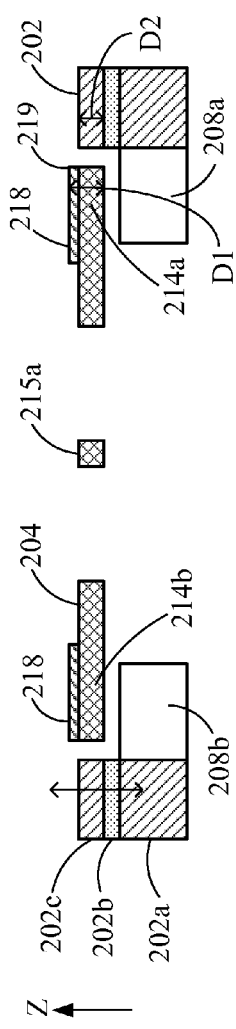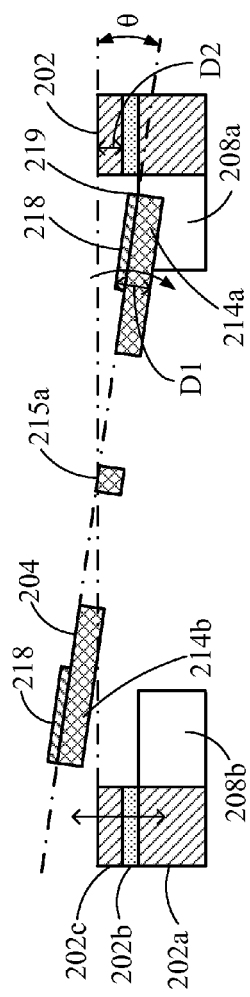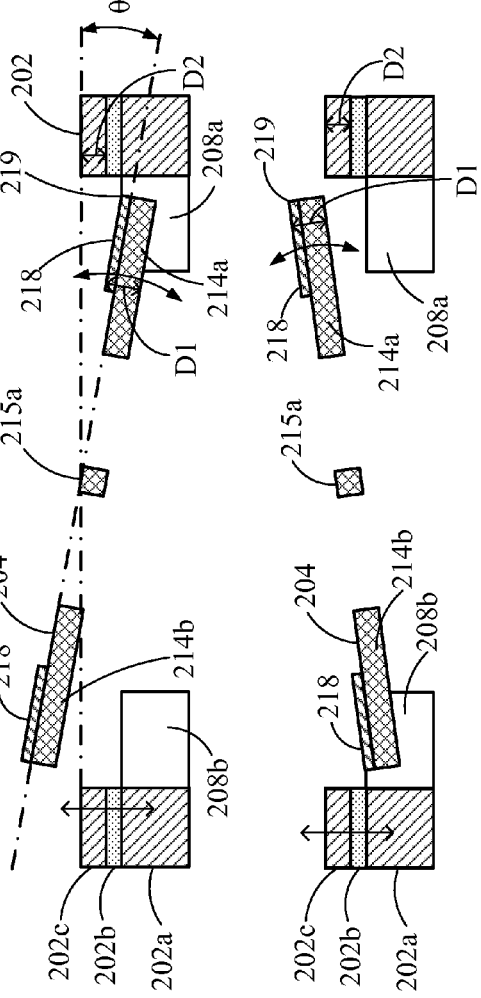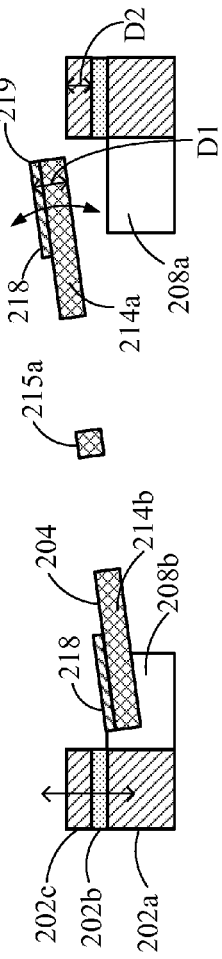
FIG. 5A
FIG. 5B
FIG. 5C
FIG. 5D

TWO-DIMENSIONAL COMB-DRIVE ACTUATOR AND MANUFACTURING METHOD THEREOF

FIELD OF THE INVENTION

The present invention relates to an actuator and method thereof, and more particularly to a two-dimensional comb-drive actuator and manufacturing method thereof.

BACKGROUND OF THE INVENTION

Recently, Micro Electro Mechanical Systems (MEMS) components featured micro structures are extensively integrated into the applications of sensing and actuating, such as accelerometers, gyroscopes, or micro scanning mirrors.

FIG. 1A is a cross-sectional view of conventional comb-drive actuator 100. The comb-drive actuator 100 includes a supporting base 102 and an oscillating element 104. The supporting base 102 comprises a substrate 106, an insulation layer 108 and a device layer 110. Both the oscillating element 104 and the device layer 110 are co-planar, and the oscillating element 104 is suspended over a cavity. Due to co-planar arrangement of the comb finger electrodes, the torque generated by the comb-drive actuator 100 is insufficient to maintain the oscillating element 104 at a specific rotational angle. In addition, a constant biasing force may be required to activate the rotational motion of the oscillating element 104, which leads to a more complicated design for the comb-drive actuators 100.

FIG. 1B is a cross-sectional view of another conventional comb-drive actuator 100. The comb-drive actuator 100 includes a supporting base 102 and an oscillating element 104. The supporting base 102 comprises a substrate 106, an insulation layer 108 and a device layer 110. The oscillating element 104 is suspended over a cavity formed by device layer 110. It is necessary to partially remove the insulation layer 108 and the device layer 110 under the oscillating element 104 by isotropic etching step for forming the comb electrode structure. However, during the isotropic etching step, lateral undercut will be formed in the device layer 110 such that the dimension of the comb electrode structure cannot be controlled precisely. To certain extent the oscillating element 104 is asymmetrically positioned in relation to the supporting base 102 and the comb-drive actuator 100 thus cannot be normally operated.

FIG. 1C is another cross-sectional view of a conventional comb-drive actuator 100. The actuator 100 includes a supporting base 102 and an oscillating element 104. The supporting base 102 further includes a substrate 106, an insulation layer 108 and a device layer 110. The height "h1" of the device layer 110 is arranged to be less than the height "h2" of the oscillating element 104. The overlapping area between the oscillating element 104 and the device layer 110 is smaller than the comb-drive actuator as depicted in FIG. 1A. Therefore, extra input power is required for the actuator as depicted in FIG. 1C to maintain the same electrostatic driving force as the actuator as depicted in FIG. 1A. In addition, due to process variation, it is difficult to maintain a constant height difference between h1 and h2 on wafer batch process. Consequently, there is a need to develop a novel comb-drive actuator and manufacturing method thereof to solve the aforementioned problems.

SUMMARY OF THE INVENTION

It is the objective of the present invention to provide a two-dimensional comb-drive actuator, which includes a supporting base, a frame and a movable body. The supporting base comprises a substrate, an insulation layer and a device layer which are vertically stacked. The supporting base includes two sets of the first comb electrodes. The frame connected to the supporting base rotates around a first rotational axis and has two sets of internal comb electrodes and two sets of external comb electrodes, wherein the two sets of external comb electrodes are interdigitated with the two sets of the first comb electrodes. The movable body is connected to the frame and rotates around a second rotational axis which is arranged to be perpendicular to the first rotational axis. The movable body further includes two sets of the second comb electrodes that are interdigitated with the two sets of internal comb electrodes, wherein the thickness of at least one of the two sets of the second comb electrodes is not equal to the thicknesses of the interdigitated internal comb electrodes. In addition, the thickness of at least one of the two sets of the external comb electrodes is not equal to the thicknesses of the interdigitated first comb electrodes.

In one embodiment of the present invention, a method of forming the two-dimensional comb-drive actuator includes the following steps:

(a) depositing a first mask layer on a device layer of a Silicon-On-Insulator (hereinafter SOI) wafer for defining a first pattern, wherein a substrate, an insulation layer and a device layer are the silicon handle layer, the buried oxide and the silicon device layer of the SOI wafer, respectively;

(b) etching the device layer to expose the insulation layer based on the first pattern for forming a trench, and removing the first mask layer after etching;

(c) depositing a silicon oxide layer on the device layer and fill the trench;

(d) removing the silicon oxide on top of the device layer;

(e) depositing a conducting layer to cover the device layer;

(f) depositing a second mask layer on the conducting layer for defining a second pattern;

(g) etching the conducting layer to expose the device layer based on the second pattern, and removing the second mask layer after etching;

(h) depositing a third mask layer on the conducting layer and the exposed device layer for defining a third pattern;

(i) etching the conducting layer and the exposed device layer based on the third pattern for forming at least one comb electrode on the conducting layer and forming at least one comb electrode, a frame and a movable body on the device layer, and removing the third mask layer after etching;

(j) Depositing a fourth mask layer on the substrate layer for defining a fourth pattern;

(k) etching the substrate to expose the insulation layer based on the fourth pattern, and removing the fourth mask layer after etching; and (l) removing the insulation layer of SOI wafer for forming the two-dimensional comb-drive actuator.

In another embodiment of the present invention, a method of forming the two-dimensional comb-drive actuator includes the following steps:

(a) depositing a first mask layer on a device layer of a SOI wafer for defining a first pattern wherein a substrate, an insulation layer and a device layer are the silicon handle layer, the buried oxide and the silicon device layer of the SOI wafer, respectively;

(b) etching the device layer to expose the insulation layer based on the first pattern for forming a trench, and removing the first mask layer after etching;

(c) depositing a silicon oxide film on the device layer and around the side-wall of the trench;

(d) depositing a second mask layer on the silicon oxide film for defining a second pattern;

(e) etching the silicon oxide film to expose the device layer based on the second pattern, and removing the second mask layer after etching;

(f) depositing a conducting layer on top of the exposed device layer and also filling the trench;

(g) depositing a third mask layer on the conducting layer for defining a third pattern;

(h) etching the conducting layer to expose the device layer based on the third pattern, and removing the third mask layer after etching;

(i) depositing a fourth mask layer on the conducting layer and the exposed device layer for defining a fourth pattern;

(j) etching the conducting layer and the exposed device layer to expose the insulation layer based on the fourth pattern, and removing the fourth mask layer after etching;

(k) Depositing a fifth mask layer on the substrate for defining a fifth pattern;

(l) etching the substrate to expose the insulation layer based on the fifth pattern; and (m) etching the insulation layer for forming the two-dimensional comb-drive actuator.

Specifically, the two-dimensional comb-drive actuator and manufacturing method thereof increase the overlapping area between comb electrodes, thus enlarge the rotation angle of the two-dimensional comb-drive actuator. Selectively patterned conducting layer effectively increases the resultant electrostatic torque for easily activating the rotational motion of the two-dimensional comb-drive actuator. In addition, the comb electrodes in the device layer and the conducting layer are formed using the same pattern in the present invention, so the problem of misalignment of the comb electrodes in the different layer can be solved. Furthermore, no isotropic etching is employed so the lateral undercut issue can be avoided.

BRIEF DESCRIPTION OF THE DRAWINGS

FIGS. 4A to 4C illustrate schematic cross-sectional views along line A-A' of a two-dimensional comb-drive actuator in FIG. 2A according to a second embodiment of the present invention;

FIGS. 5A to 5D illustrate schematic cross-sectional views along line B-B' of a two-dimensional comb-drive actuator in FIG. 2A according to a third embodiment of the present invention;

DETAILED DESCRIPTION OF THE PREFERRED EMBODIMENTS

Figure 2A:
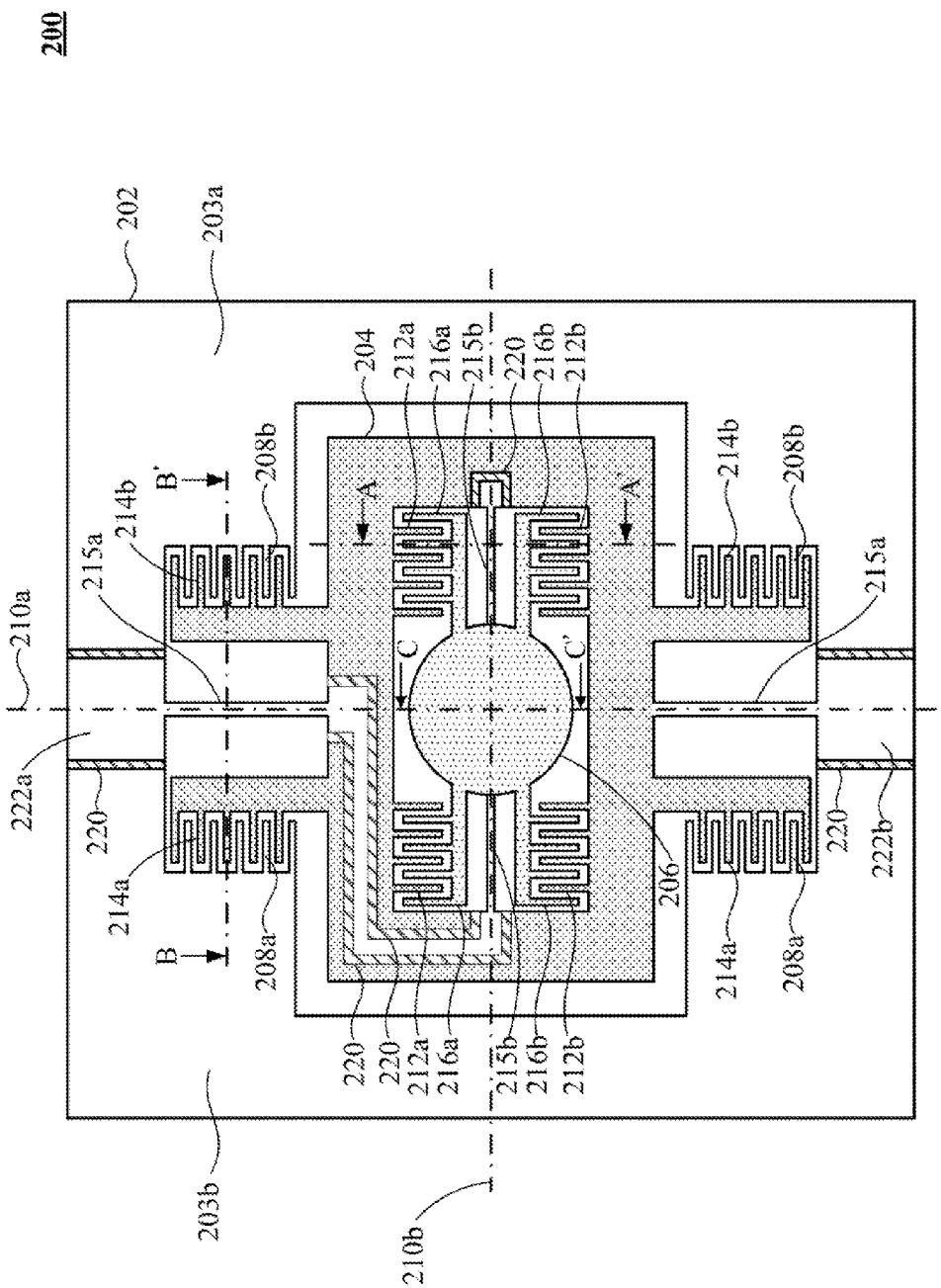
FIG. 2A illustrates a schematic top view of a two-dimensional comb-drive actuator in accordance with an embodiment of the present invention.

FIG. 2A illustrates an exemplary top view of a two-dimensional comb-drive actuator 200 according to one embodiment of the present invention. The two-dimensional comb-drive actuator 200, manufactured by micromachining processes includes a supporting base 202, a frame 204 and a movable body 206. The supporting base 202 has two sets of the first comb electrodes (208a, 208b) acting as stator.

The frame 204, connecting to the supporting base 202 by a pair of first torsion bars 215a along a first rotational axis 210a, is free to rotate around the first rotational axis 210a. On frame 204 there are two sets of internal comb electrodes (212a, 212b) and two sets of external comb electrodes (214a, 214b). The two sets of external comb electrodes (214a, 214b) are interdigitated (e.g. interlaced arrangement) with the two sets of first comb electrodes (208a, 208b). When an electrical potential difference is applied between the external comb electrodes (214a, 214b) and the first comb electrodes (208a, 208b), an electrostatic driving torque arises between the corresponding electrodes. Consequently the frame 204 is allowed to rotate around the first rotational axis 210a relatively to the supporting base 202.

The movable body 206, connecting to the frame 204 by a pair of second torsion bars 215b along a second rotational axis 210b which is perpendicular to the first rotational axis 210a, is free to rotate around the second rotational axis 210b. The movable body 206 further includes two sets of second comb electrodes (216a, 216b) interdigitated (e.g. interlaced arrangement) with the two sets of internal comb electrodes (212a, 212b) of the frame 204. Applying an electrical potential difference between the interdigitated internal comb electrodes (212a, 212b) and the second comb electrodes (216a, 216b), an electrostatic driving torque arises between the corresponding electrodes. Consequently the movable body 206 rotates around the second rotational axis 210b relatively to the frame 204.

Additionally, trench 220 divides the two-dimensional comb-drive actuator 200 into four electrically insulated regions, the right region 203a and the left region 203b of the supporting base 202, the frame 204 and the movable body 206. Consequently the two sets of second comb electrodes (216a, 216b) are electrically insulated from the two sets of internal comb electrodes (212a, 212b), and the two sets of external comb electrodes (214a, 214b) are electrically insulated from the two sets of the first comb electrodes (208a, 208b), respectively. Trench 220 further electrically insulates a portion of supporting base 202 to form the contact areas (222a, 222b). An electrical potential can be applied from a power source to the movable body 206 via the contact area 222a and the first torsion bar 215a located on the upper portion of supporting base 202 in FIG. 2A and the second torsion bar 215b. Another electrical potential can be applied from a power source to the frame 204 via the contact area 222b and the first torsion bar 215a located on the lower portion of supporting base 202 in FIG. 2A. Thus, electrical potential differences may be formed between interdigitated sets of electrodes connected to the frame 204 and the movable body 206 when designated electrical potentials are applied to the contact areas (222a, 222b), respectively. Similarly, an electrical potential can be individually applied to the right region 203a and the left region 203b of the supporting base 202. Electrical potential differences may be formed between interdigitated sets of electrodes connected to the frame 204 and the supporting base 202 when designated electrical potentials are applied to the right region 203a and the left region 203b, respectively.

In the two-dimensional comb-drive actuator 200 of the present invention, the electrostatic driving torque "T" is proportional to the ratio of the variance of overlapping area "∂A" to the variance of rotation angle "∂θ" of the interdigitated comb electrodes. That is, electrostatic driving torque "T" is proportional to the partial differential of the overlapping area over the rotation angle "∂A/∂θ". The electrostatic driving torque "T" is expressed as the following equation (1):

$$T \propto \frac{\partial A}{\partial \theta} \quad (1)$$

wherein the electrostatic driving torque "T" is formed while electrical potential difference exists among the interdigitated sets of comb electrodes.

In one case, when electrical potential difference is applied between the two sets of external comb electrodes (214a, 214b) and the two sets of first comb electrodes (208a, 208b), the resultant electrostatic torque "T" drives the frame 204 to rotate around a first rotational axis 210a relative to the supporting base 202.

In another case, an electrical potential difference is applied between the two sets of the internal comb electrodes (212a, 212b) and the two sets of the second comb electrodes (216a, 216b), the resultant electrostatic torque "T" drives the movable body 206 to rotate around a second rotational axis 2010b relative to the frame 204. In one embodiment of the present invention, a two-dimensional comb-drive actuator 200 has a conducting layer 218 disposed on top of at least one set of the first comb electrodes (208a, 208b), the internal comb electrodes (212a, 212b), the two external comb electrodes (214a, 214b) and the second comb electrodes (216a, 216b), as shown in FIGS. 2B to 2E, FIGS. 3A to 3D, FIGS. 4A to 4C, FIGS. 5A to 5D, and FIGS. 6A to 6D. Along a Z-axis direction perpendicular to the first and second rotational axes (210a, 210b), a conducting layer 218 is coated on a surface of at least one of the two sets of internal comb electrodes (212a, 212b) and the two sets of second comb electrodes (216a, 216b), and on a surface of at least one of the two sets of first comb electrodes (208a, 208b) and the two sets of external comb electrodes (214a, 214b). As shown in FIGS. 2B-2E and 4A-4C, a comb electrode the thickness D1 of combing the conducting layer 218 and at least one of the two sets of internal comb electrodes (212a, 212b) and the two sets of second comb electrodes (216a, 216b) is unequal to a comb electrode thickness D2 of each of the others of the two sets of internal comb electrodes and the two sets of second comb electrodes in the Z-axis direction. Respectively, as shown in FIGS. 3A-3D, 5A-5D and 6A-6D, a comb electrode the thickness D1 of combing the conducting layer 218 and at least one of the two sets of first comb electrodes (208a, 208b) and the two sets of external comb electrodes (214a, 214b) is unequal to a comb electrode thickness D2 of each of the others of the two sets of first comb electrodes (208a, 208b) and the two sets of external comb electrodes (214a, 214b) in the Z-axis direction. Respectively, each comb electrode thickness D2 does not contain the conducting layer 218. The material of the conducting layer 218 may be doped poly-silicon, metal or any conducting material. The structure design and the fabrication of the conducting layer 218 on top of the supporting base 202, the frame 204 and the movable body 206 are described in details as followed.

Figure 2B:
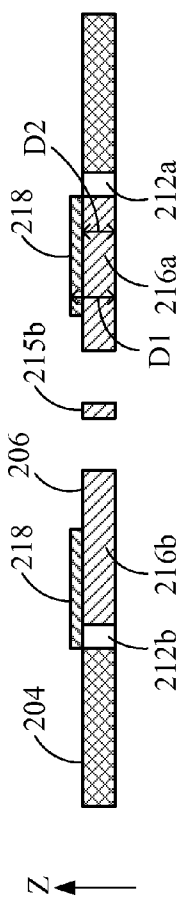
FIGS. 2B to 2E illustrate schematic cross-sectional views along line A-A' of a two-dimensional comb-drive actuator in FIG. 2A according to a first embodiment of the present invention.

Referring to FIG. 2A and FIGS. 2B to 2E, FIGS. 2B to 2E are schematic cross-sectional views along line A-A' of a two-dimensional comb-drive actuator 200 in FIG. 2A according to the first embodiment of the present invention. As shown in FIG. 2A and FIG. 2B, each of the two sets of second comb electrodes (216a, 216b) and each of the two sets of internal comb electrodes (212a, 212b) are located on the opposite sides of the second rotational axis 210b, respectively. The conducting layer 218 is selectively disposed on top of the second comb electrodes 216a and on top of the internal comb electrodes 212b, respectively such that the comb electrode thickness D1 of combining the second comb electrodes 216a and the conducting layer 218 is greater than that of interdigitated internal comb electrodes 212a, and the comb electrode thickness D1 of combining the internal comb electrodes 212b and the conducting layer 218 is greater than the comb electrode thickness D2 of the interdigitated second comb electrodes 216b. The thickness of the second comb electrodes 216a may be equal to the thickness of the internal comb electrodes 212b.

Figure 2C:
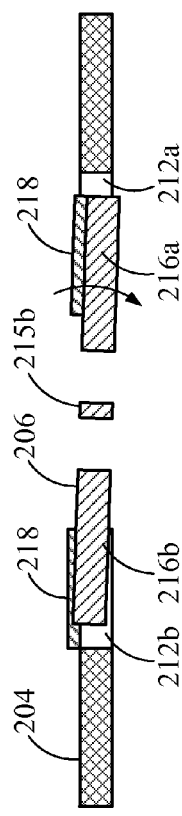
Figure 2D:
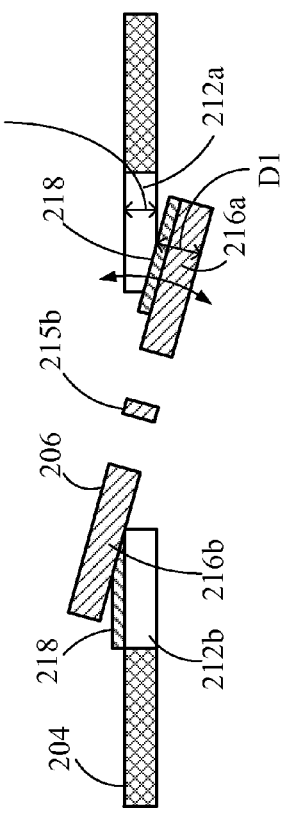
Figure 2E:
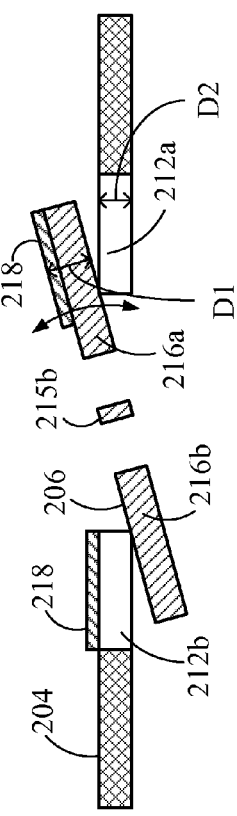

Applying a fixed electrical potential difference between the inner comb electrodes (212a, 212b) and the second comb electrodes (216a, 216b) will generate electrostatic torque to rotate the movable body 206 clockwise around the second rotational axis 210b with respective to the frame 204 in order to reach a force balance between the electrostatic torque generated from the interdigitated comb electrodes and the restoring force of the torsion bars 215b as shown in FIG. 2C. Applying an alternating electrical potential difference between the second comb electrodes (216a, 216b) and the internal comb electrodes (212a, 212b) will cause the movable body 206 oscillates around the second rotational axis 210b.

Figure 2F:
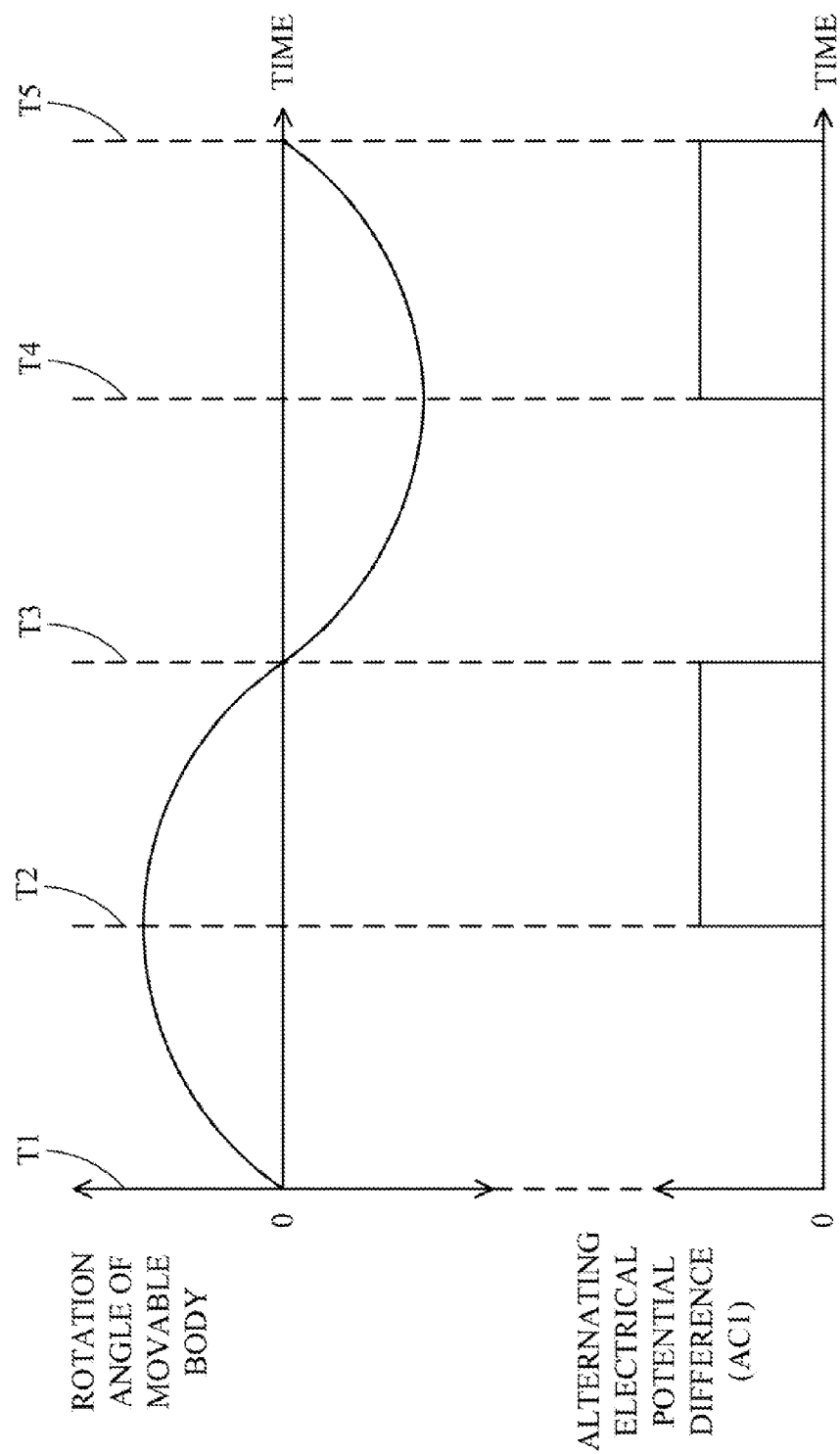
FIG. 2F is a schematic relationship diagram for both the phase and the amplitude of the rotation angle and the applied alternating electrical potential difference versus time when the movable body in FIG. 2B rotates around a second rotational axis.

FIG. 2F is a schematic relationship diagram for both the phase and the amplitude of the rotation angle and the alternating electrical potential difference versus time when the movable body 206 rotates around the second rotational axis 210b. The horizontal axis represents time and the vertical axis represents the rotation angle of the movable body 206 and an alternating electrical potential difference "AC1" between the second comb electrodes (216a, 216b) and the internal comb electrodes (212a, 212b). Applying an alternating electrical potential difference "AC1" between the second comb electrodes (216a, 216b) and the internal comb electrodes (212a, 212b), the movable body 206 is able to rotate clockwise from original position in FIG. 2B (corresponding to time "T1") to an extreme position in FIG. 2D (corresponding to time "T2"), rotate back to original position in FIG. 2B (corresponding to time "T3"), then rotate to another extreme position as in FIG. 2E (corresponding to time "T4") and finally return back to original position in FIG. 2B (corresponding to time "T5") to complete an oscillation cycle during a periodic time interval. The rotation angle of movable body 206 versus time is a sinusoidal trajectory as shown in FIG. 2F. The signal of the alternating electrical potential difference "AC1" may be a variety of waveforms, e.g. square wave, triangular wave, sinusoidal wave and half-sinusoidal wave. In one embodiment, if the maximum amplitude of the alternating electrical potential difference "AC1" is fixed, drive signal with square waveform is typically the most effective method (consume less electrical energy) to drive the movable body 206 to oscillate to the maximum rotational angle. For conventional in-plane comb drive actuator, the internal comb electrodes (212a, 212b) and the second comb electrodes (216a, 216b) are arranged symmetrically about the second rotational axis 210b with the same thickness. When a fixed electrical potential difference is applied between the two sets of second comb electrodes (216a, 216b) and the two sets of interdigitated internal comb electrodes (212a, 212b), the resultant electrostatic driving forces exerted on the movable body 206 in the opposite sides of the second rotational axis 210b are of the same magnitude but in opposite directions; therefore, the driving forces cancel out each other. In order to initiate oscillation motion of the movable body 206 around the second rotational axis 210b, it is necessary to provide unbalanced driving forces on the opposite sides of the second rotational axis 210b by either structural un-symmetry due to manufacture tolerance or by additional electrodes on one side of the comb drive electrodes in prior art. For the case of utilizing manufacture tolerances, the inherent manufacturing tolerances may still result in difficulty on initiating oscillation motion especially if the electrical potentials applied to the interdigitated comb drive electrodes gets higher and the additional electrodes for initiating the oscillation are typically limited to generate slight unbalance electrostatic force and may not contribute to higher oscillation amplitude.

Figure 1A:
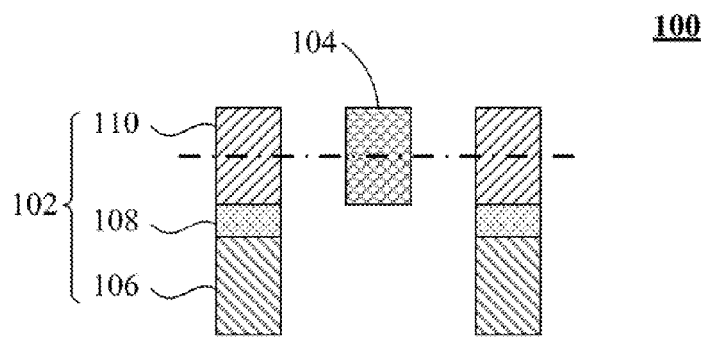
FIGS. 1A to 1C are schematic views of illustrative electrostatic comb-drive actuators in the prior art.
Figure 2G:
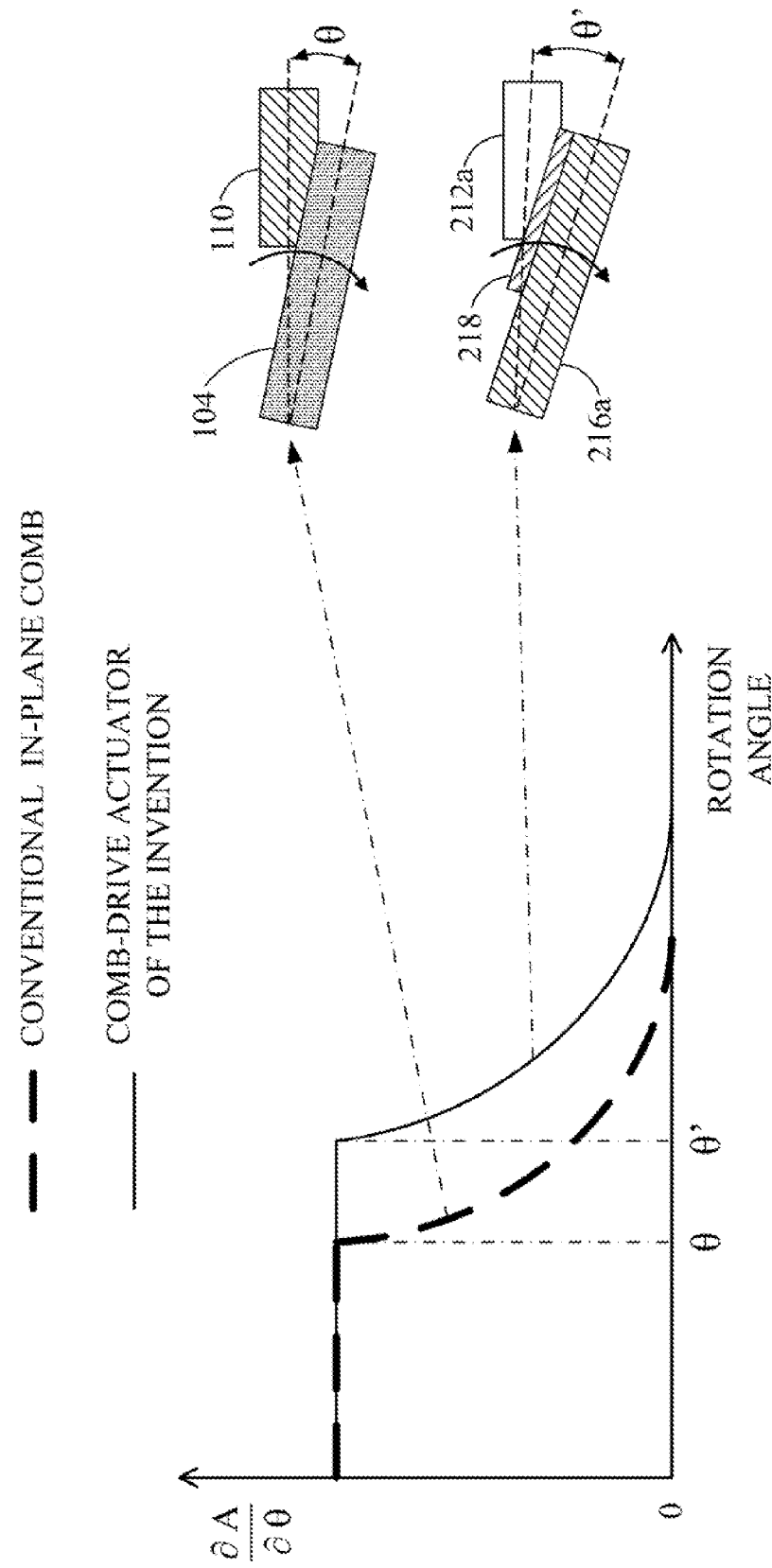
FIG. 2G is a schematic relationship diagram of the partial differential of the overlapping area over the rotation angle $\partial A/\partial \theta$ versus rotation angle for both the conventional comb actuator and the comb actuator in the present invention.

Referring to FIG. 2G, the dash line and the solid line illustrate the partial differential of the overlapping area over the rotation angle $\partial A/\partial \theta$ versus rotation angle for the conventional comb actuator in FIG. 1A and the present comb actuator in FIG. 2B, respectively. In conventional comb actuator, $\partial A/\partial \theta$ remains at its maximum until the tip of the top surface of oscillating element 104 rotates to the bottom surface of the device layer 110 where the rotation angle equals to $\theta$. Beyond angle $\theta$ $\partial A/\partial \theta$ decreases gradually, therefore the resultant electrostatic torque cannot sustain the oscillating element 104 to further rotate.

In present invention, the selectively disposed conducting layer 218 is used to enlarge the overlapping range between the set of internal comb electrodes 212a and the set of interdigitated second comb electrodes 216a by effectively increasing the thicknesses of the rotator electrodes (combining second comb electrodes 216a and selectively disposed conducting layer 218). The maximum rotation angle is extended from angle $\theta$ for the case without conducting layer 218 to angle $\theta'$. In the present invention, a conducting layer 218 normally having a thickness ranged from several $\mu m$ to hundred $\mu m$ is selectively disposed on specific comb drive electrodes to not only able to generate initial rotation motion of the movable body 206 even if fixed electrical potential difference is applied between the second comb electrodes (216a, 216b) and the interdigitated internal comb electrodes (212a, 212b) as shown in FIG. 2C but also able to increase the oscillation amplitude of the movable body 206 by effectively increasing the overlapping area and the variance of the overlapping area over rotation angle between the interdigitated comb electrodes due to selectively disposed conducting layer 218 on the comb electrodes.

Figure 3A:
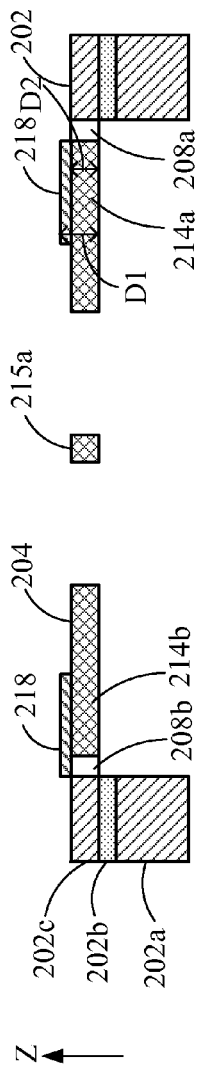
FIGS. 3A to 3D illustrate schematic cross-sectional views along line B-B' of a two-dimensional comb-drive actuator in FIG. 2A according to a first embodiment of the present invention.

Referring to FIG. 2A and FIGS. 3A to 3D, FIGS. 3A to 3D are schematic cross-sectional views along line B-B' of a two-dimensional comb-drive actuator 200 in FIG. 2A according to the first embodiment of the present invention. As shown in FIGS. 2A and 3A, the supporting base 202 has a substrate 202a, an insulation layer 202b and a device layer 202c which are vertically stacked. The two sets of first comb electrodes (208a, 208b) on the device layer 202c are interdigitated with the two sets of external comb electrodes (214a, 214b) and are located on the opposite sides of the first rotational axis 210a, respectively.

The conducting layer 218 is selectively disposed on top of the external comb electrodes 214a and on top of the first comb electrodes 208b respectively such that the comb electrode thickness D1 of combining the external comb electrodes 214a and the conducting layer 218 is greater than that of the first comb electrodes 208a, and the comb electrode thickness D1 of combining the first comb electrodes 208b and the conducting layer 218 is greater than the comb electrode thickness D2 of the external comb electrodes 214b. The thickness of the external comb electrodes 214a can be equal to that of the first comb electrodes 208b.

Figure 3B:
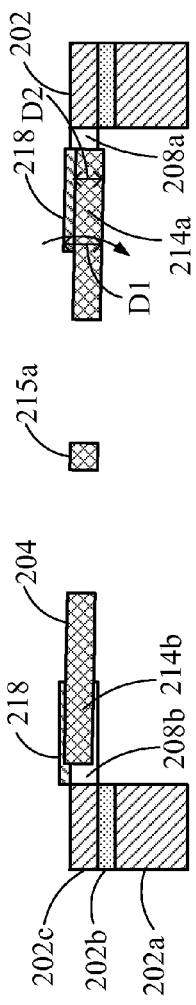

Referring to FIG. 3A and FIG. 3B, applying a fixed electrical potential difference between the two sets of external comb electrodes (214a, 214b) and the two sets of interdigitated first comb electrodes (208a, 208b) will cause the frame 204 to rotate clockwise around the first rotational axis 210a to a fixed angle with respective to the supporting base 202 in order to reach a force balance between the electrical torque generated from the interdigitated comb electrodes and the restoring force of the torsion bars 215b as shown in FIG. 3B.

Figure 3C:
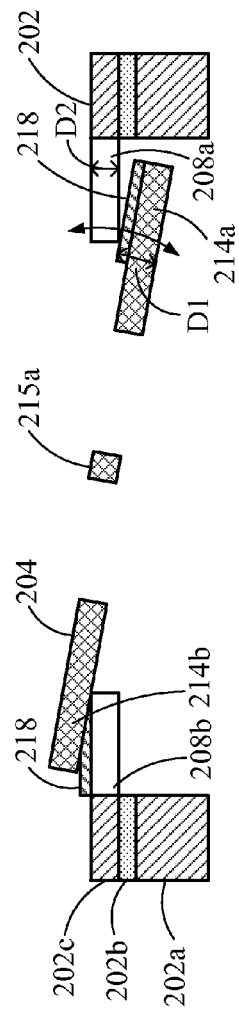
Figure 3D:
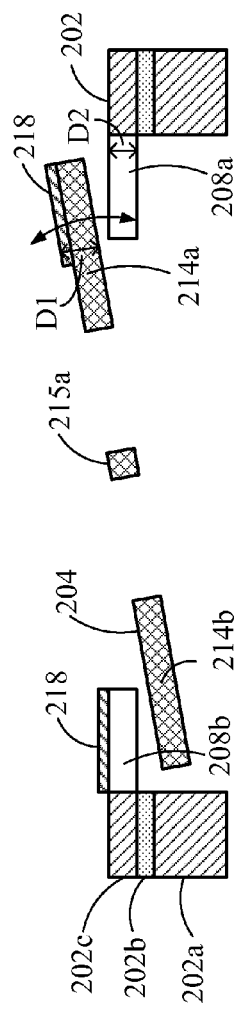

As shown in FIG. 3C and FIG. 3D, applying an alternating electrical potential difference between the external comb electrodes (214a, 214b) and the first comb electrodes (208a, 208b) will cause the frame 204 to oscillate around the first rotational axis 210a.

Figure 3E:
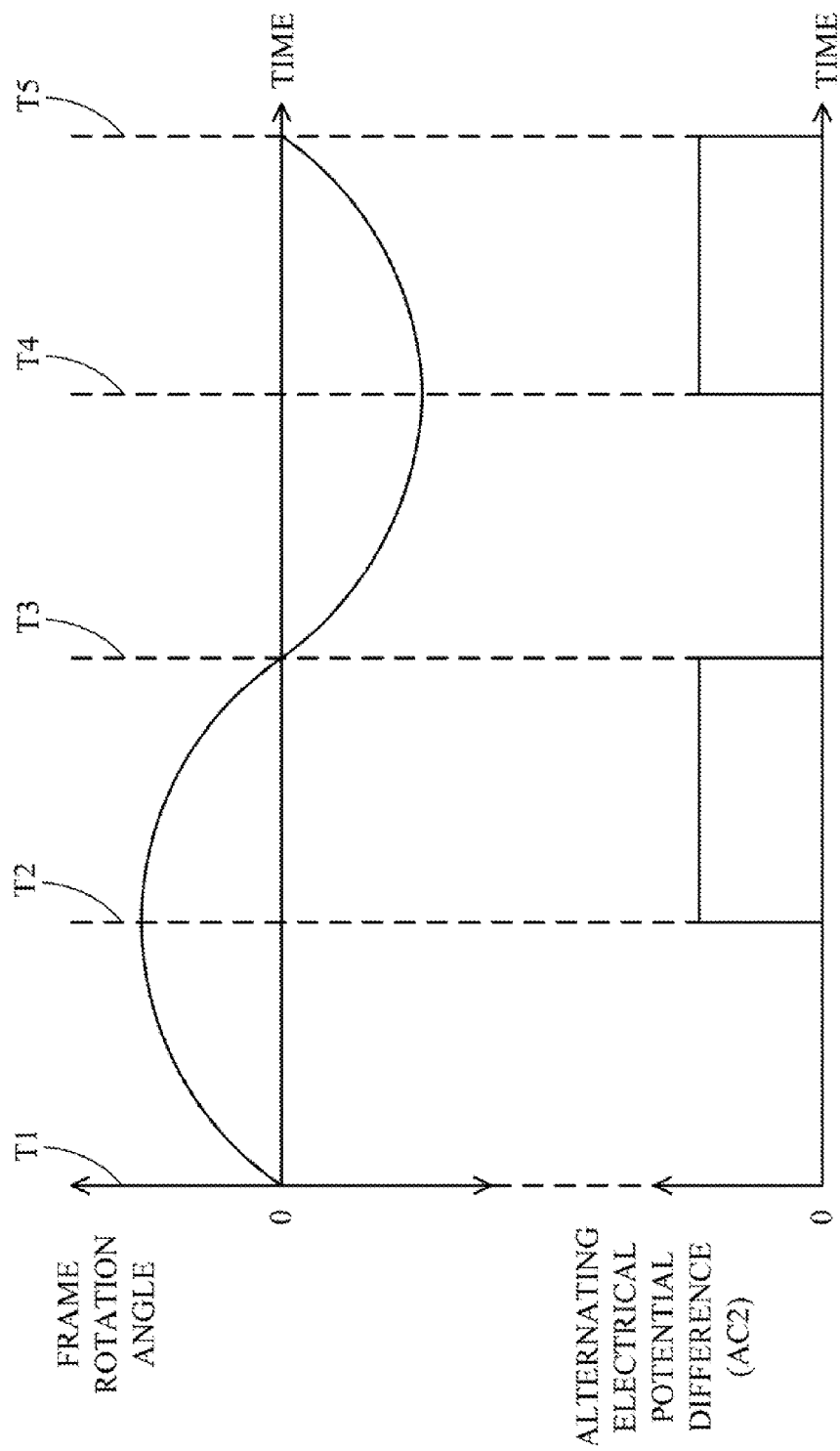
FIG. 3E is a schematic relationship diagram for both the phase and the amplitude of the rotation angle and the applied alternating electrical potential difference versus time when the frame in FIG. 3A rotates around a first rotational axis according to a first embodiment of the present invention.

FIG. 3E is a schematic relationship diagram for both the phase and the amplitude of the rotation angle and the alternating electrical potential difference versus time when the frame 204 rotates around the first rotation axis 210a. The horizontal axis represents time and the vertical axis represents the rotation angle of the frame 204 and an alternating electrical potential difference "AC2" between the external comb electrodes (214a, 214b) and the first comb electrodes (208a, 208b). Applying an alternating electrical potential difference "AC2" between the second comb electrodes external comb electrodes (214a, 214b) and the first comb electrodes (208a, 208b), the frame 204 is able to rotate clockwise from original position in FIG. 3A (corresponding to time "T1") to an extreme position in FIG. 3C (corresponding to time "T2"), rotate back to original position in FIG. 3A (corresponding to time "T3"), then rotate to another extreme as in FIG. 3D (corresponding to time "T4") and finally returns back to original position in FIG. 3A (corresponding to time "T5") to complete an oscillation cycle during a periodic time interval. The rotation angle of frame 204 versus time is a sinusoidal trajectory as shown in FIG. 3E. The signal of the alternating electrical potential difference "AC2" may be a variety of waveforms, e.g. square wave, triangular wave, sinusoidal wave and half-sinusoidal wave. In one embodiment, if the maximum amplitude of the alternating electrical potential difference "AC2" is fixed, drive signal with square waveform is typically the most effective method (consume less electrical energy) to drive the frame 204 to oscillate to the maximum rotation angle.

For conventional in-plane comb drive actuator, the external comb electrodes (214a, 214b) and the first comb electrodes (208a, 208b) are arranged symmetrically about the first rotational axis 210a with the same thickness. When a fixed electrical potential difference is applied between the two sets of external comb electrodes (214a, 214b) and the two sets of interdigitated first comb electrodes (208a, 208b), the resultant electrostatic driving forces exerted on the frame 204 in the opposite sides of the first rotational axis 210a are of the same magnitude but in opposite directions; therefore, the driving forces cancel out each other. In order to initiate oscillation motion of the frame 204 around the second rotational axis, it is necessary to provide unbalanced driving forces on the opposite sides of the first rotational axis 210a by either structural un-symmetry due to manufacturing tolerance or by additional electrodes on one side of the comb drive electrodes in prior art. For the case of utilizing manufacture tolerances, the inherent manufacturing tolerances may still result in difficulty on initiating oscillation motion especially if the electrical potentials applied to the interdigitated comb drive electrodes gets higher and the additional electrodes for initiating the oscillation are typically limited to generate slight unbalance electrostatic force and may not contribute to higher oscillation amplitude.

In the present invention, a conducting layer 218 is selectively disposed on specific comb drive electrodes to not only able to generate initial rotation motion of the frame 204 even if fixed electrical potential difference is applied between the external comb electrodes (214a, 214b) and the interdigitated first comb electrodes (208a, 208b) as shown in FIG. 3B but also able to increase the overlapping area and the variance of the overlapping area over rotation angle between the interdigitated comb electrodes due to selectively disposed conducting layer 218 on the comb electrodes.

Referring to FIG. 2A and FIGS. 4A to 4C, FIGS. 4A to 4C are schematic cross-sectional views along line A-A' of a two-dimensional comb-drive actuator 200 in FIG. 2A according to a second embodiment of the present invention. As shown in FIGS. 2A and 4A, each of the two sets of second comb electrodes (216a, 216b) and each of the two sets of internal comb electrodes (212a, 212b) are located on the opposite sides of the second rotational axis 210b, respectively. The conducting layer 218 is selectively disposed on top of the internal comb electrodes 212b such that the comb electrode thickness D1 of combining the internal comb electrodes 212b and the conducting layer 218 is greater than the comb electrode thickness D2 of the interdigitated second comb electrodes 216b. The thickness of the second comb electrodes 216a may be equal to the thickness of the interdigitated internal comb electrodes 212a.

Referring to FIG. 4A and FIG. 4B, applying a fixed electrical potential difference between the two sets of second comb electrodes (216a, 216b) and the two sets of interdigitated internal comb electrodes (212a, 212b) will cause the movable body 206 to rotate clockwise around the second rotational axis 210b with respective to the frame 204 in order to reach a force balance between the electrostatic torque generated from the interdigitated comb electrodes and the restoring force of the torsion bars 215b as shown in FIG. 4B.

Applying an alternating electrical potential difference between the second comb electrodes (216a, 216b) and the internal comb electrodes (212a, 212b) will cause the movable body 206 to oscillate around the second rotational axis 210b. The relationship for both the phase and the amplitude of the rotation angle and the alternating electrical potential difference versus time when the movable body 206 rotates around the second rotational axis 210b is similar to the first embodiment of the present invention and have been detailed in FIG. 2F.

Referring to FIG. 2A and FIGS. 5A to 5D, FIGS. 5A to 5D are schematic cross-sectional views along line B-B' of a two-dimensional comb-drive actuator 200 shown in FIG. 2A according to a third embodiment of the present invention. As shown in FIG. 2A and FIG. 5A, the supporting base 202 has a substrate 202a, an insulation layer 202b and a device layer 202c which are vertically stacked. The two sets of the first comb electrodes (208a, 208b) are located on the substrate 202a and are disposed on the opposite sides of the first rotational axis 210a, respectively. The external comb electrodes (214a, 214b), disposed on the device layer 202c, are interdigitated with the two sets of first comb electrodes (208a, 208b) with a vertical offset as shown in FIG. 5A. A conducting layer 218 is selectively disposed on top of the two sets of the external comb electrodes (214a, 214b) such that the comb electrode thickness D1 of combining the conducting layer 208 and the external comb electrodes (214a, 214b) is greater than the comb electrode thickness D2 of the device layer 202c.

Applying a fixed electrical potential difference between the external comb electrodes 214a and the first comb electrodes 208a will generate electrostatic torque to rotate the frame 204 around the first rotational axis 210a clockwise. Once the external comb electrodes 214a engage with the first comb electrodes 208a, the differentiation of the overlapping area between the interdigitated comb electrodes over the rotation angle, ∂A/∂θ remains at its maximum until the tip of the top surface of the conducting layer 218 on the external comb electrodes 214a rotates to the top surface of the first comb electrodes 208a where the rotation angle equals to θ_max as shown in FIG. 5C as long as the resulting electrostatic torque is sufficient to overcome the restoring torque generated from the first torsion bars 215a. In a conventional vertical comb electrode design, there is no conducting layer 218 on top of the external comb electrodes 214a so ∂A/∂θ remains at its maximum until the frame 204 rotates to an angle θ that is smaller than θ_max.

In present invention, the selectively disposed conducting layer 218 is used to enlarge the overlapping range between the two sets of external comb electrodes (214a, 214b) and the two sets of interdigitated first comb electrodes (208a, 208b) by effectively increasing the thicknesses of the rotator electrodes (combining external comb electrodes (214a, 214b) and selectively disposed conducting layer 218). The maximum rotation angle of the frame 204 is extended from angle θ in FIG. 5B for the case without conducting layer 218 to angle θ_max in FIG. 5C.

Figure 5E:
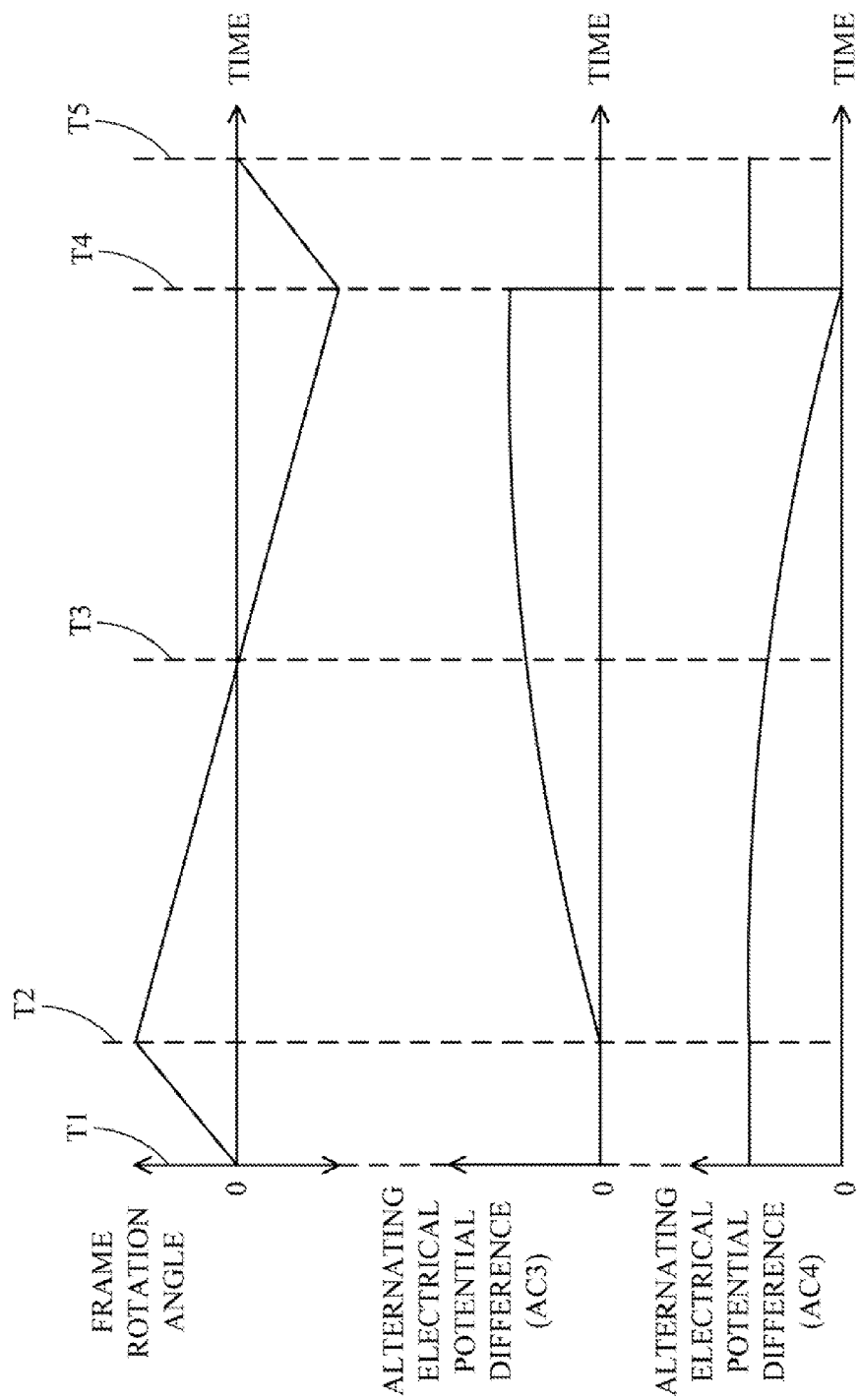
FIG. 5E is a schematic relationship diagram for both the phase and the amplitude of the rotation angle and the applied alternating electrical potential difference versus time when the frame in FIG. 5A rotates around a first rotational axis according to an embodiment of the present invention.

As shown in FIG. 5C, applying an electrical potential difference between the vertically interdigitated external comb electrodes 214a and the first comb electrodes 208a will cause the frame 204 to rotate clockwise around the first rotational axis 210a to a deflection angle θ_max in FIG. 5C. The selectively disposed conducting layer 218 on top of the external comb electrodes effectively increases the maximum deflection angle to θ_max from angle θ if no conducting layer 218 is disposed on top of the external comb electrodes. After the frame 204 reaching θ_max, reducing or switching off the applied electrical potential difference will cause the frame 204 to rotate counterclockwise due to restoring force exerted by the torsion bars 215a and to return to the original position in FIG. 5A. After the frame 204 returning to its original position in FIG. 5A, applying another electrical potential difference between the vertically interdigitated external comb electrodes 214b and the first comb electrodes 208b will cause the frame 204 to rotate counterclockwise around the first rotational axis 210a to a deflection angle θ_max in another direction in FIG. 5D. After the frame 204 reaching θ_max, reducing or switching off the applied electrical potential difference will cause the frame 204 to rotate clockwise due to restoring force exerted by the torsion bars 215a and to return to the original position in FIG. 5A. Thus, applying alternating electrical potential differences between the two sets of external comb electrodes (214a, 214b) and the two sets of first comb electrodes (208a, 208b), one can control the oscillation motion of the frame 204 around the first rotational axis 210a. FIG. 5E is a schematic relationship diagram for both the phase and the amplitude of the rotation angle and the alternating electrical potential differences versus time when the frame 204 rotates around the first rotation axis 210a. The horizontal axis represents time and the vertical axis represents the rotation angle of the frame 204 and the alternating electrical potential differences "AC3" and "AC4". When an alternating electrical potential difference "AC3" is applied between the external comb electrodes 214b and the first comb electrodes 208b, and an alternating electrical potential difference "AC4" is applied between the external comb electrodes 214a and the first comb electrodes 208a, the frame 204 rotates clockwise from the original position in FIG. 5A (corresponding to time "T1") to a maximum deflection angle θ_max in FIG. 5C (corresponding to time "T2"), then rotates counterclockwise back to the original position in FIG. 5A (corresponding to time "T3") and continues to rotate to maximum deflection angle θ_max in another direction as in FIG. 5D (corresponding to time "T4") and finally rotates back to original position in FIG. 5A (corresponding to time "T5") to complete a bi-directional oscillation motion during a periodic time interval.

Figure 5F:
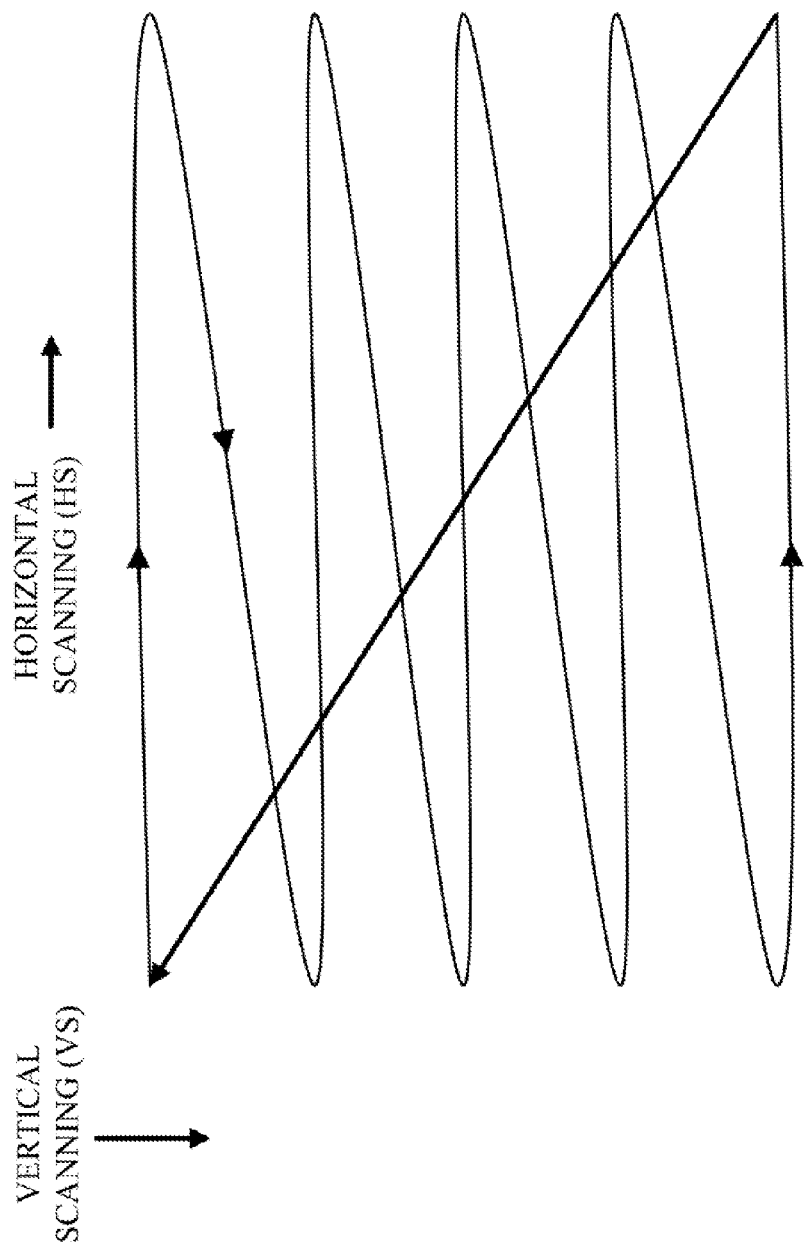
FIG. 5F illustrates a schematic view of a raster scan trajectory formed by two-dimensional comb-drive actuator according to an embodiment of the present invention.

In the above embodiment, the rotation angle of frame 204 versus time may be a saw-tooth type trajectory, as shown in FIG. 5E through proper control of the alternating electrical potential differences, "AC3" and "AC4". During the time interval between "T1" to "T2" and between "T4" to "T5", the frame 204 may be controlled to rotate rapidly by suitable driving waveform of the alternating electrical potential differences "AC3" and "AC4". In the meantime, if an alternating electrical potential difference "AC1" is applied between the two sets of second comb electrodes (216a, 216b) and the two sets of internal comb electrodes (212a, 212b), as shown in FIGS. 2B to 2D or FIGS. 4A to 4C, the movable body 206 swings both vertically and horizontally along the raster scan trajectory as shown in FIG. 5F.

Figure 6A:
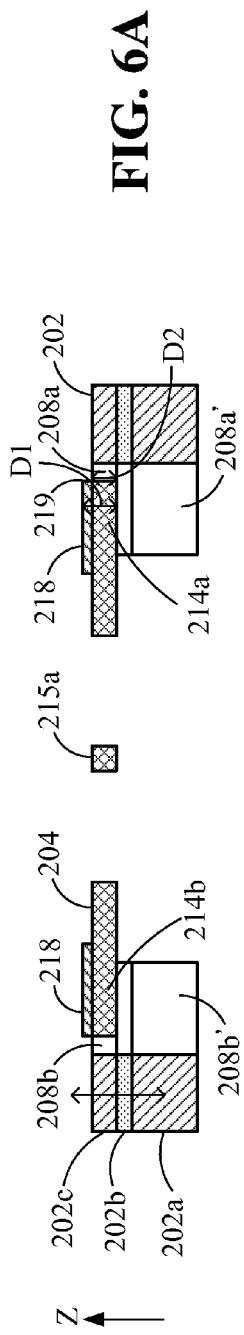
FIGS. 6A to 6D illustrate schematic cross-sectional views along line B-B' of a two-dimensional comb-drive actuator in FIG. 2A according to a fourth embodiment of the present invention.
Figure 6B:
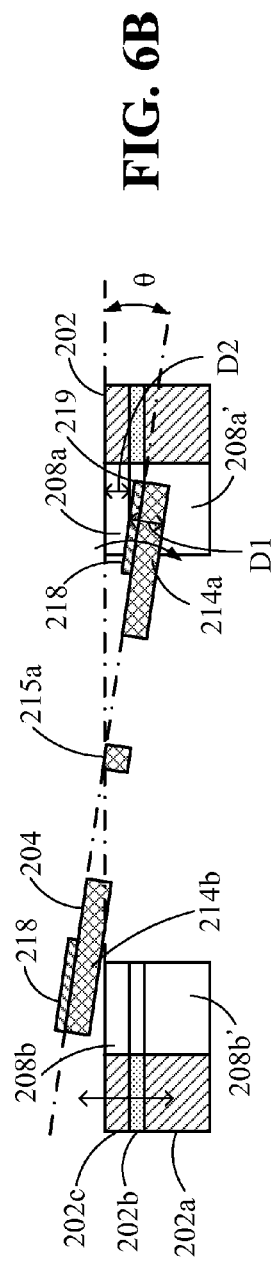

Referring to FIG. 2A and FIGS. 6A to 6D, FIGS. 6A to 6D are schematic cross-sectional views along line B-B' of a two-dimensional comb-drive actuator 200 in FIG. 2A according to a forth embodiment of the present invention. As shown in FIG. 6A, the supporting base 202 consists of a substrate 202a having two sets of the third comb electrodes (208a', 208b'), an insulation layer 202b and a device layer 202c having two sets of the first comb electrodes (208a, 208b) wherein the third comb electrodes (208a', 208b') and the first comb electrodes (208a, 208b) are vertically aligned and stacked, and are arranged to be located on the opposite sides of the rotational axis 210a. The two sets of the first comb electrodes (208a, 208b) and the two sets of third comb electrodes (208a', 208b') are electrically isolated from each other by the insulation layer 202b and are interdigitated with the two sets of external electrodes (214a, 214b) of the frame 204 as shown in FIG. 6A. In this embodiment, a conducting layer 218 is selectively disposed on top of the two sets of external comb electrodes (214a, 214b) such that the combing thickness D1 of the comb electrodes of the conducting layer 218 and external comb electrodes (214a and 214b) acting as rotator is greater than the comb electrode thickness D2 of the first comb electrode (208a, 208b) acting as stator.

Figure 6C:
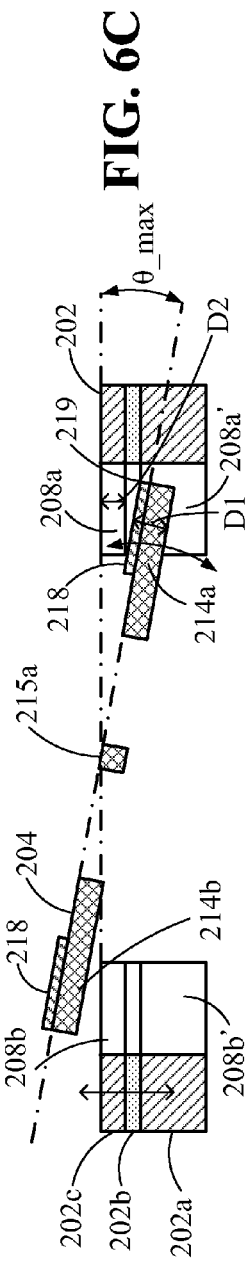
Figure 6D:
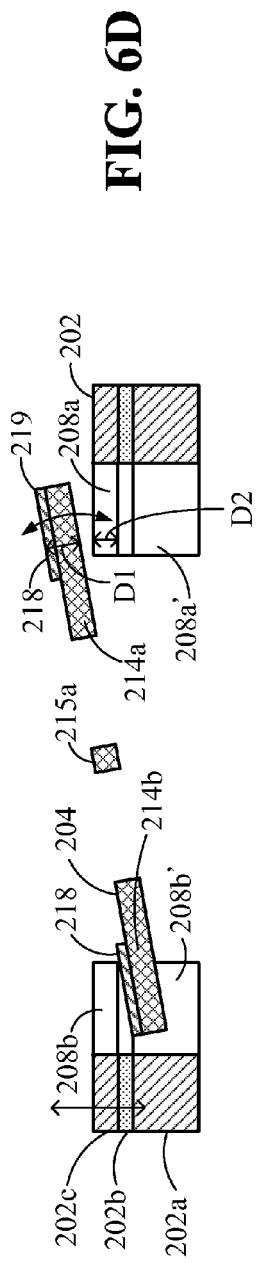

As shown in FIG. 6C, applying an electrical potential difference between the vertically interdigitated external comb electrodes 214a and the first comb electrodes 208a' will cause the frame 204 to rotate clockwise around the first rotational axis 210a to a deflection angle θ_max in FIG. 6C. The selectively disposed conducting layer 218 on top of the external comb electrodes effectively increases the maximum deflection angle to θ_max from angle θ if no conducting layer 218 is disposed on top of the external comb electrodes. After the frame 204 reaching θ_max, reducing or switching off the applied electrical potential difference will cause the frame 204 to rotate counterclockwise due to restoring force exerted by the torsion bars 215a and to return to the original position in FIG. 6A. To accelerate the return of the frame 204 from position in FIG. 6C to its original position in FIG. 6A, an additional electrical potential difference may be applied between the external comb electrodes (214a, 214b) and the third comb electrodes (208a, 208b) to generate electrical attraction force between the interdigitated electrodes in addition to the mechanical restoring torque from the torsion bars 215a. After the frame 204 returning to its original position in FIG. 6A, applying the other electrical potential difference between the vertically interdigitated external comb electrodes 214b and the first comb electrodes 208b' will cause the frame 204 to rotate counterclockwise around the first rotational axis 210a to a deflection angle θ_max in another direction in FIG. 6D. Similarly, the frame 204 may be rotated clockwise back to its original position in FIG. 6A from the position in FIG. 6D by both mechanical restoring torque of the torsion bars 215a and the electrostatic driving torque between external comb electrodes (214a, 214b) and the third comb electrodes (208a, 208b) with another applied potential difference.

In the embodiment of the present invention, the selectively disposed conducting layer 218 on top of the external comb electrodes (214a, 214b) is used to effectively increase the thicknesses of the rotator comb electrodes (combing external comb electrodes 214a, 214b and selectively disposed conducting layer 218) for enlarging the overlapping range between the two sets of external comb electrodes (214a, 214b) and either the two sets of interdigitated first comb electrodes (208a, 208b) or the two sets of interdigitated third comb electrodes (208a', 208b'). The maximum rotation angle of the frame 204 is extended from angle θ in FIG. 6B for the case without conducting layer 218 to angle θ_max in FIG. 6C.

Figure 6E:
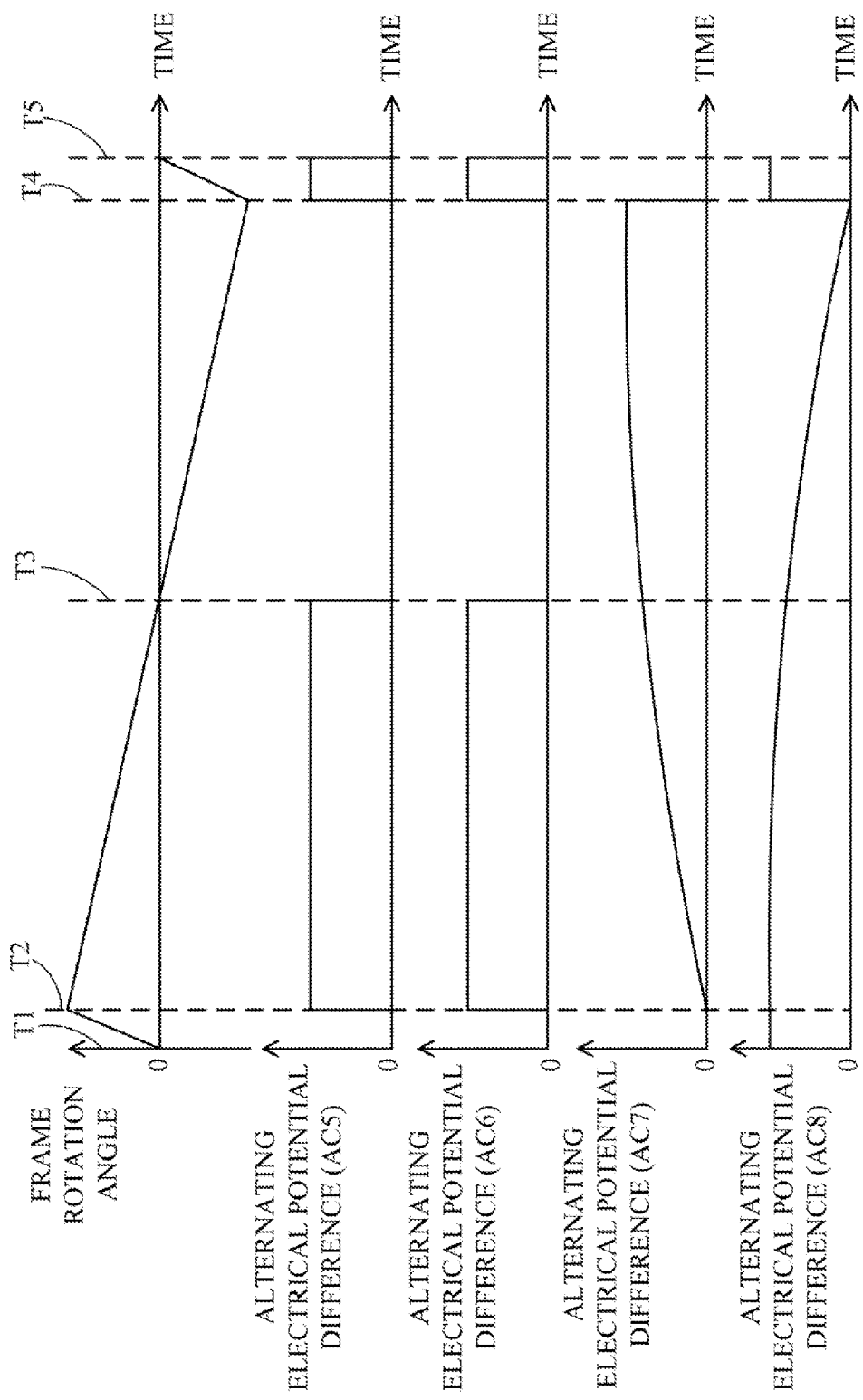
FIG. 6E is a schematic relationship diagram for both the phase and the amplitude of the rotation angle and the applied alternating electrical potential difference versus time when the frame in FIG. 6A rotates around a first rotational axis according to one embodiment of the present invention.

Thus applying alternating electrical potential differences between the two sets of external comb electrodes (214a,

214b) and either the two sets of first comb electrodes (208a, 208b) or the two sets of third comb electrodes (208a', 208b'), one may control the oscillation motion of the frame 204 around the first rotational axis 210a. FIG. 6E is a schematic relationship diagram for both the phase and the amplitude of the rotation angle and the alternating electrical potential differences versus time when the frame 204 rotates around the first rotation axis 210a. The horizontal axis represents time and the vertical axis represents the rotation angle of the frame 204 and the alternating electrical potential differences "AC5", "AC6", "A7" and "A8". When an alternating electrical potential difference "AC5" is applied between the external comb electrodes 214b and the first comb electrodes 208b, an alternating electrical potential difference "AC6" is applied between the external comb electrodes 214a and the first comb electrodes 208a, an alternating electrical potential difference "AC7" is applied between the external comb electrodes 214b and the first comb electrodes 208b', and an alternating electrical potential difference "AC8" is applied between the external comb electrodes 214a and the first comb electrodes 208a', the frame 204 rotates clockwise from the original position in FIG. 6A (corresponding to time "T1") to a maximum deflection angle θ_max in FIG. 6C (corresponding to time "T2"), then rotates counterclockwise back to the original position in FIG. 6A (corresponding to time "T3"), and continues to rotate to maximum deflection angle θ_max in another direction as in FIG. 6D (corresponding to time "T4") and finally rotates back to the original position in FIG. 6A (corresponding to time "T5") to complete a controlled bi-directional oscillation motion during a periodic time interval.

In the above embodiment, the rotation angle of frame 204 versus time may be a saw-tooth type trajectory, as shown in FIG. 6E through proper control of the alternating electrical potential differences, "AC5", "AC6", "AC7" and "AC8". During the time interval between "T1" to "T2" and between "T4" to "T5", the frame 204 may be controlled to rotate rapidly by suitable driving waveform of the alternating electrical potential differences "AC5", "AC6", "A7" and "A8". In the meantime, if an alternating electrical potential difference "AC1" is applied between the second comb electrodes (216a, 216b) and internal comb electrodes (212a, 212b), as shown in FIGS. 2B to 2D or FIGS. 4A to 4C, the movable body 206 swings both vertically and horizontally along the raster scan trajectory as shown in FIG. 5F.

According to the aforementioned descriptions, the two-dimensional comb-drive actuator 200 utilizes the selectively disposed conducting layer 218 to increase the thickness of the comb electrodes acting as rotator for enlarging the overlapping range between the interdigitated comb electrodes acting as stator. As a result, the maximum rotation angle of the two-dimensional comb-drive actuator 200 is increased. Additionally, the two-dimensional comb-drive actuator 200 may be employed with different types of electrical potential differences, e.g. fixed electrical potential difference and/or alternating electrical potential difference, such that the oscillation motion can be precisely controlled up to larger range.

Figure 7:
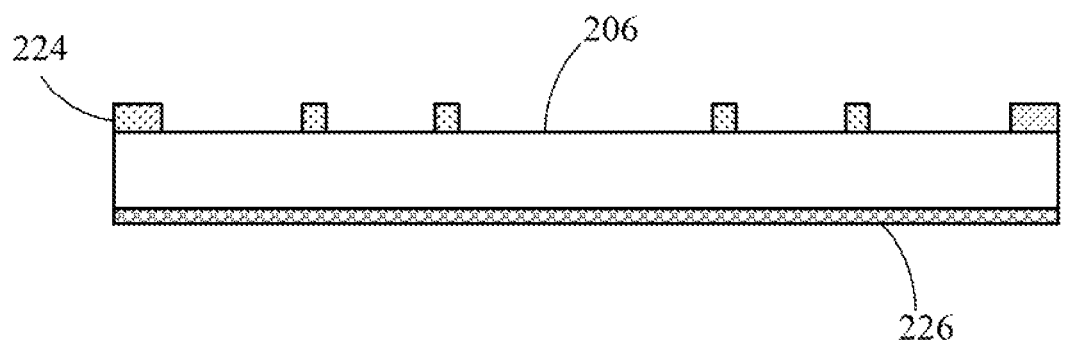
FIG. 7 illustrates a schematic cross-sectional view along line C-C' of the reinforced structure of two-dimensional comb-drive actuator in FIG. 2A according to one embodiment of the present invention.

FIG. 7 is a schematic cross-sectional view along line C-C' of the reinforced structure of movable body 206 in the two-dimensional comb-drive actuator 200 shown in FIG. 2A, according to one embodiment of the present invention. In the above-mentioned first to fourth embodiments, the top surface of the movable body 206 further includes a patterned reinforced structure 224 for enhancing the mechanical stiffness of the movable body 206. The thickness of the reinforced structure 224 is identical to the thickness of the conducting layer 218 with the same manufacturing process. The bottom surface of the movable body 206 may further include a reflective layer 226 for increasing the reflection index of the movable body 206 in specific wavelength range for certain optical applications. The material of the reflective layer 226 can be metallic and/or dielectric. Person skilled in the art should be noted that the surface of the reflective layer 226 faces the incident light while the reinforced structure 224 is employed in the two-dimensional comb-drive actuator 200.

Figure 8A:
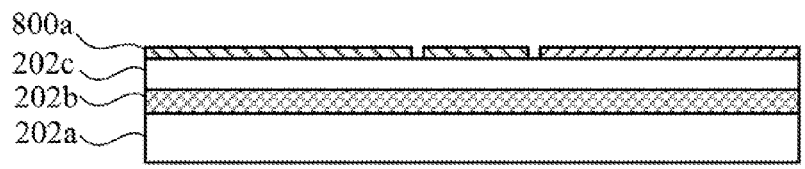
FIGS. 8A to 8M illustrate schematic cross-sectional views and exemplary manufacturing procedures of the two-dimensional comb-drive actuator according to a first embodiment of the present invention.

Referring to the two-dimensional comb drive actuator in FIG. 2A, FIG. 2B and FIG. 3A, FIGS. 8A to 8M are a procedure of manufacturing the two-dimensional comb-drive actuator 200 according to a first embodiment of the present invention. The procedure of manufacturing a two-dimensional comb-drive actuator 200 includes the following steps:

In FIG. 8A, a first mask pattern 800a consisting of material such as photoresist is deposited on a silicon-on-insulator (SOI) wafer consisting of a substrate layer 202a, an insulation layer 202b and a device layer 202c.

Figure 8B:
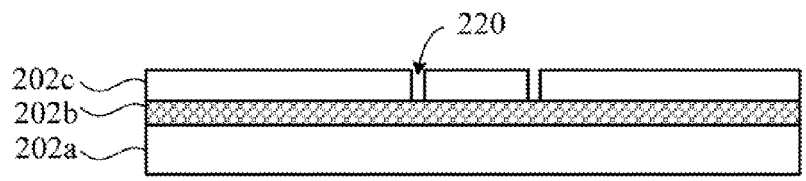

In FIG. 8B, the device layer 202c is etched to expose the insulation layer 202b based on the first pattern 800a for forming trenches 220, and the first mask pattern 800a is removed after etching the device layer 202c.

Figure 8C:
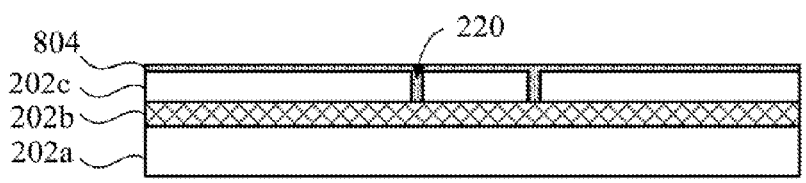

In FIG. 8C, a silicon oxide layer 804 is deposited on top of the device layer 202c. The trenches 220 are also filled with silicon dioxide.

Figure 8D:
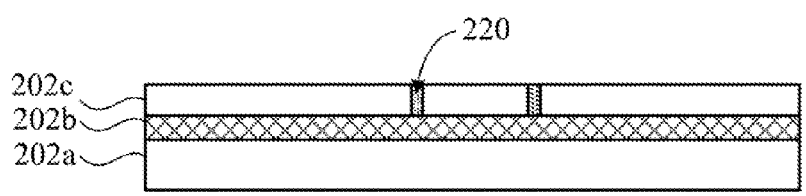

In FIG. 8D, the silicon oxide layer 804 on top of the device layer 202c is removed.

Figure 8E:
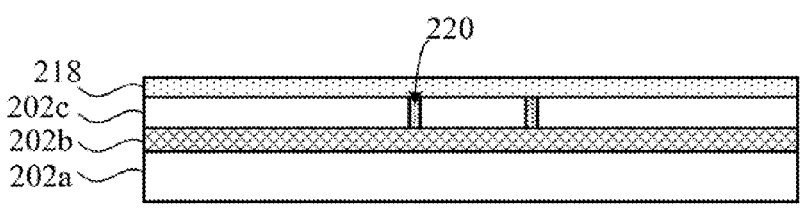

In FIG. 8E, a conducting layer 218, metal, metallic alloy and/or doped poly-silicon is deposited on top of the device layer 202c. In one embodiment, a deposition process is used to form the ploy-silicon layer. In another embodiment, electroplating or sputtering process is used to form the metal layer. The conducting layer 218 may have a thickness ranged from 5 μm to 100 μm in one embodiment, or has arbitrary thickness in another embodiment.

Figure 8F:
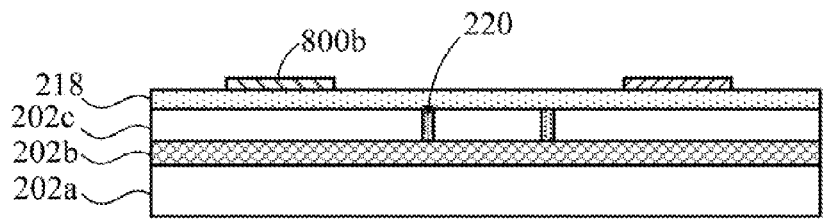

In FIG. 8F, a second mask pattern 800b consisting of material such as photoresist is deposited on top of the conducting layer 218.

Figure 8G:
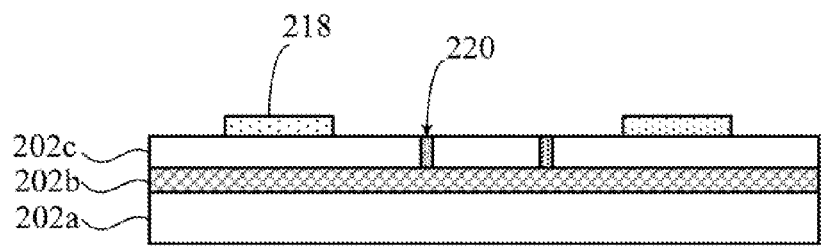

In FIG. 8G, the conducting layer 218 is patterned based on the second pattern 800b to selectively expose the device layer 202c, and the second mask layer is removed thereafter.

Figure 8H:
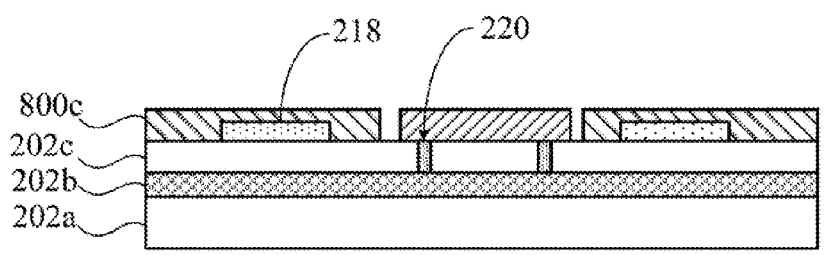

In FIG. 8H, a third mask pattern 800c is deposited on top of the conducting layer 218 and on top of the exposed device layer 202c.

Figure 1B:
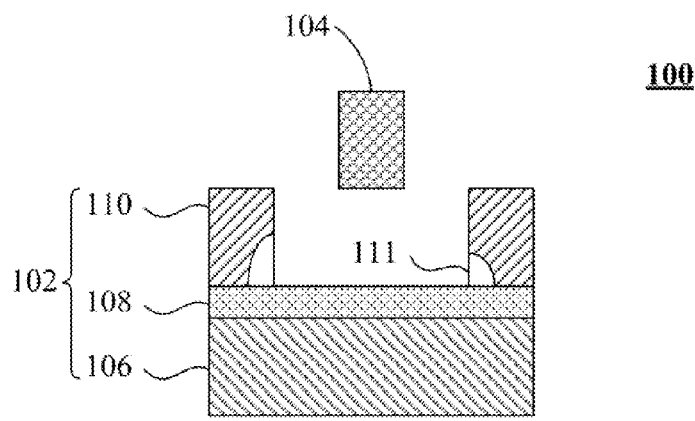
Figure 1C:
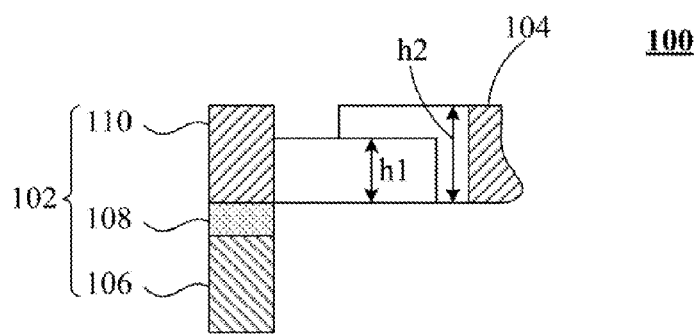
Figure 8I:
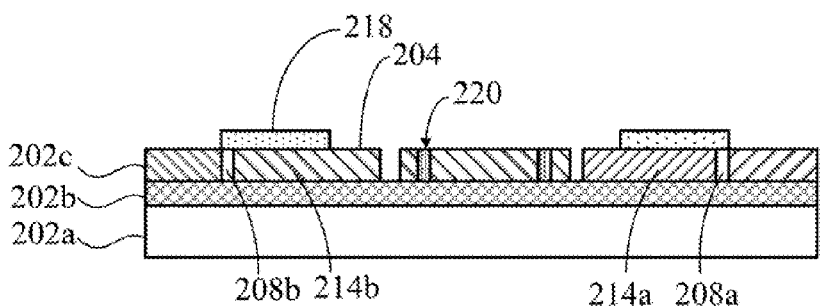

In FIG. 8I, referring to FIGS. 2B and 3A, the device layer 202c are patterned to form at least one set of comb electrodes with vertically stacked conducting layer, a frame 204 and a movable body 206 based on the third mask pattern 800c. The third mask layer 800c is removed thereafter. An anisotropic etching process such as Deep Reactive-ion Etching (DRIE) is performed for etching the conducting layer 218 and the device layer 202c. Specifically, the manufacturing method of two-dimensional comb-drive actuator 200 utilizes the third pattern 800c on the third mask layer to etch the conducting layer 218 and the device layer 202c sequentially to form the comb electrodes of the conducting layer 218, the comb electrodes of the device layer 202c, the supporting base 202, the frame 204 and the movable body 206. The etching process stops until the insulation layer 202b is exposed. Because all the comb electrodes are formed by the same mask, the problem of conventional misalignment of the comb electrodes in the actuator can be solved. Further, referring to FIG. 1B, the problem of improper lateral undercut 111 when the isotropic etching is employed in the device layer 110 can be solved.

Figure 8J:
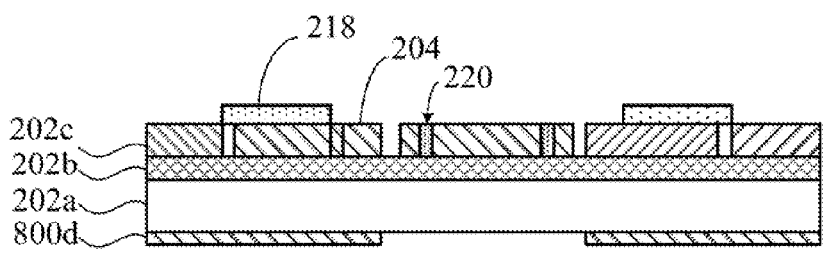

In FIG. 8J, a fourth mask layer is deposited on the substrate 202a for defining a fourth pattern 800d.

Figure 8K:
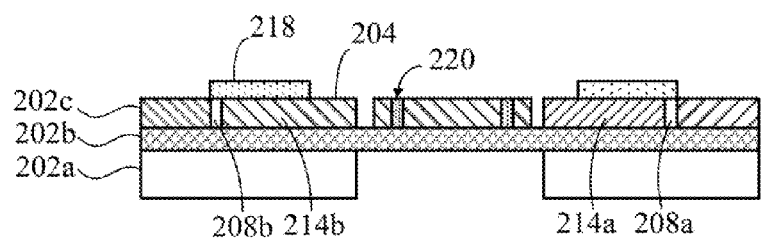

In FIG. 8K, the substrate 202a is etched to expose the insulation layer 202b based on the fourth pattern 800d, and the fourth mask layer is removed after etching the substrate 202a.

Figure 8L:
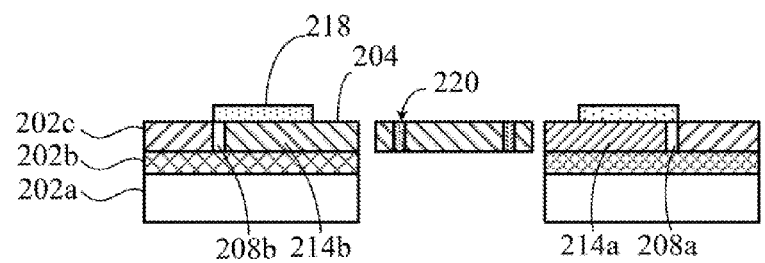

In FIG. 8L, the insulation layer 202b is etched to release the structures of the two-dimensional comb-drive actuator 200. The frame 204 and the movable body 206 are allowed to rotate freely around the first rotational axis 210a and the second rotational axis 210b, respectively.

Figure 8M:
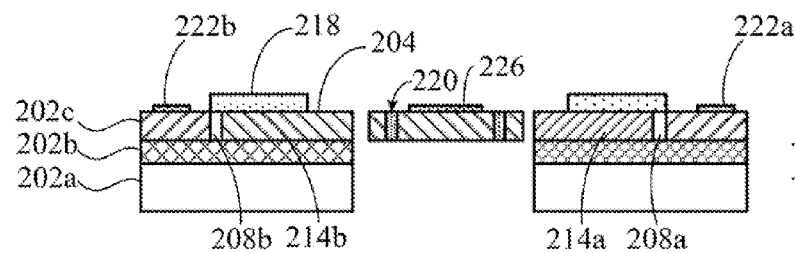

In FIG. 8M, a metal layer is deposited on top of the device layer 202c for forming the reflective layer 226.

Figure 9A:
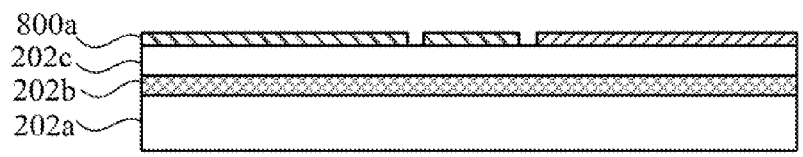
FIGS. 9A to 9O illustrate schematic cross-sectional views and exemplary manufacturing procedures of the two-dimensional comb-drive actuator according to a second embodiment of the present invention.
Figure 9B:
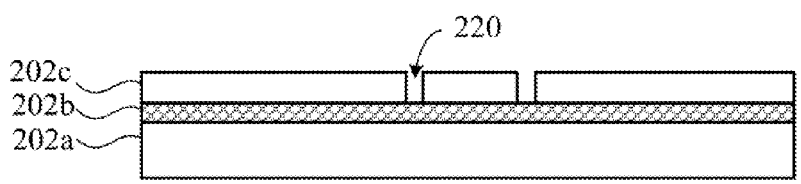
Figure 9C:
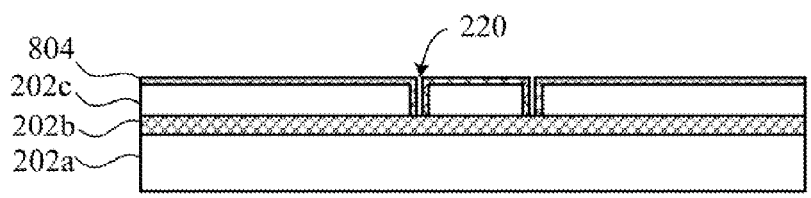
Figure 9D:
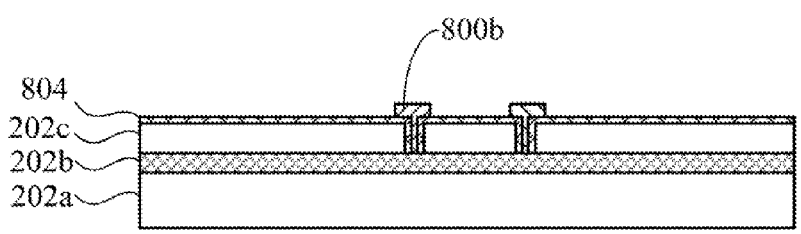
Figure 9E:
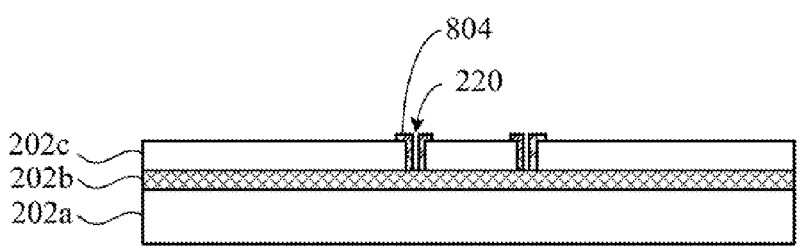
Figure 9F:
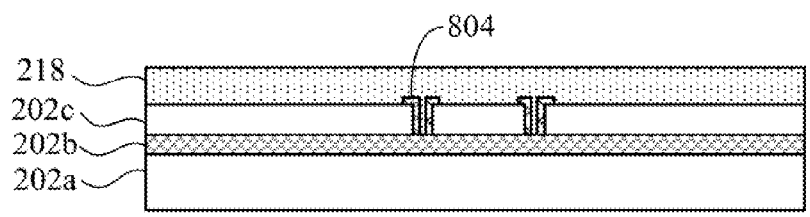
Figure 9G:
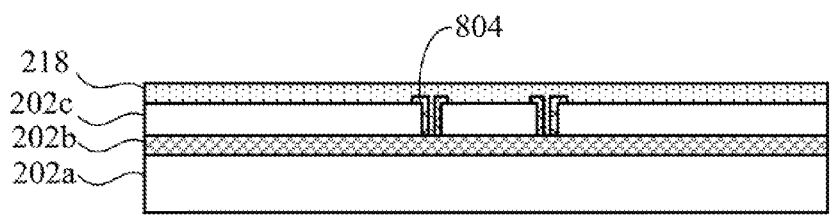
Figure 9H:
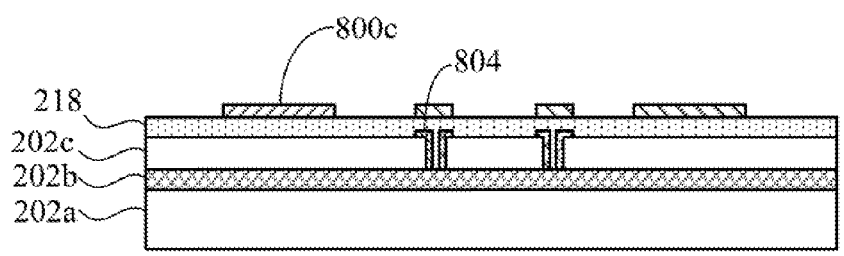
Figure 9I:
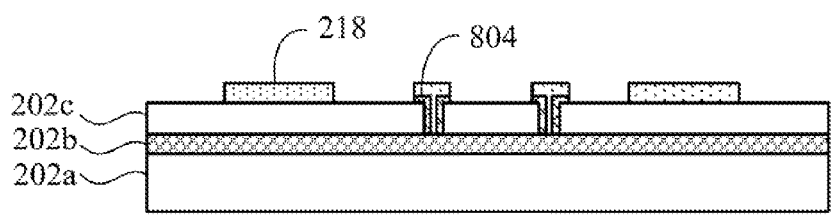
Figure 9J:
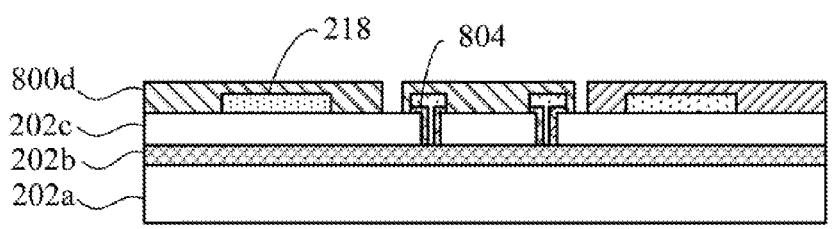
Figure 9K:
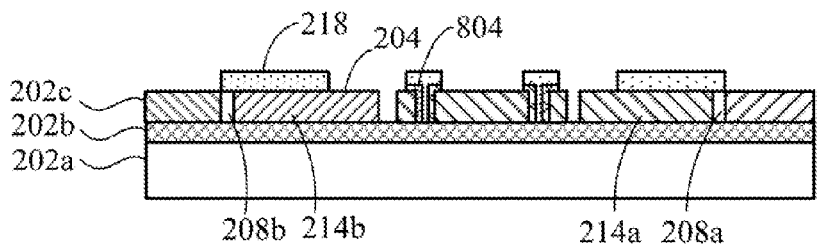
Figure 9L:
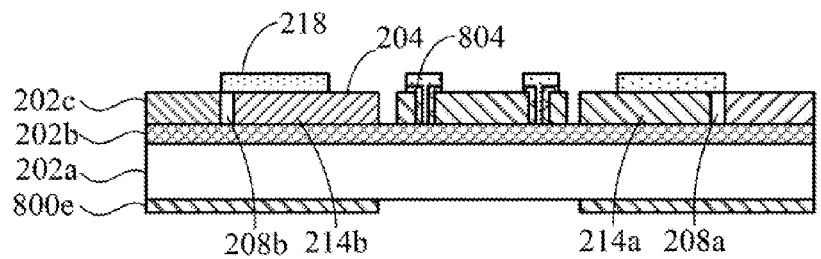
Figure 9M:
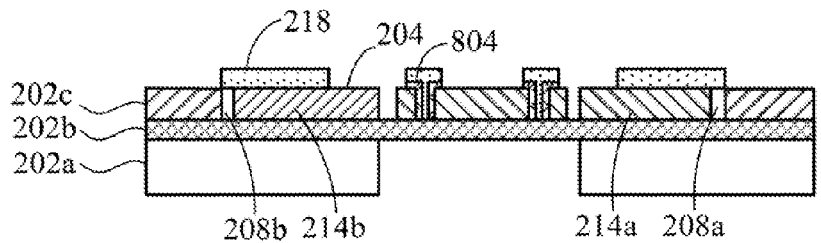
Figure 9N:
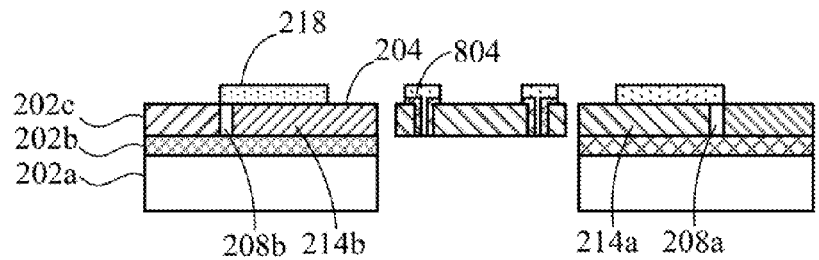
Figure 9O:
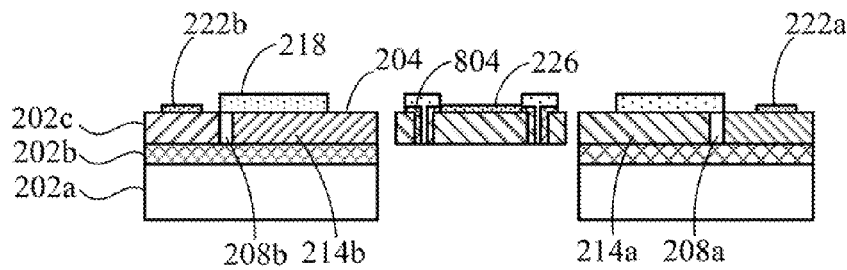

Referring to FIG. 2A and FIGS. 9A to 9O, FIGS. 9A to 9O are a procedure of manufacturing the two-dimensional comb-drive actuator 200 according to a second embodiment of the present invention. The procedure of manufacturing a two-dimensional comb-drive actuator 200 includes the following steps:

In FIG. 9A, a first mask pattern 800a consisting of material such as photoresist is deposited on a SOI wafer consisting a substrate layer 202a, an insulation layer 202b and a device layer 202c.

In FIG. 9B, the device layer 202c is etched to expose the insulation layer 202b based on the first pattern 800a for forming a trench 220, and the first mask pattern 800a is removed after etching the device layer 202c.

In FIG. 9C, a silicon oxide film 804 is deposited on the side-wall of the trenches and on top of the device layer 202c.

In FIG. 9D, a second mask pattern 800b is deposited on the silicon oxide film 804.

In FIG. 9E, the silicon oxide film 804 is etched to expose the device layer 202c based on the second mask pattern 800b, and the second mask pattern 800b is removed thereafter.

In FIG. 9F, a conducting layer 218 is deposited on top of the exposed device layer 202c. The trenches 220 are also filled the conducting material in this process. The material of the conducting layer 218 can be doped poly-silicon or metal. In one embodiment, a deposition process is used to form the ploy-silicon. In another embodiment, electroplating, evaporation or sputtering process may be used to form the metal.

In FIG. 9G, the conducting layer 218 is polished to a predetermined thickness. In one preferred embodiment, the predetermined thickness has a range from 5 µm to 100 µm. In other embodiment, the thickness can be arbitrary.

In FIG. 9H, a third mask pattern 800c is deposited on top of the conducting layer 218.

In FIG. 9I, the conducting layer 218 is patterned to expose the device layer 202c based on the third mask pattern 800c, and the third mask pattern is removed thereafter.

In FIG. 9J, a fourth mask pattern 800d is deposited on top of the conducting layer 218 and the exposed device layer 202c.

In FIG. 9K, the conducting layer 218 and the device layer 202c are sequentially etched for forming at least one set of comb electrodes with vertically stacked conducting layer 218, and a frame 204 and a movable body 206 on the device layer 202c based on the fourth mask pattern 800d. The fourth mask pattern is then removed thereafter. An anisotropic etching process such as DRIE is performed for etching the conducting layer 218 and the device layer 202c. Specifically, the manufacturing method of two-dimensional comb-drive actuator 200 utilizes the fourth mask pattern 800d to etch the conducting layer 218 and the device layer 202c sequentially to form the comb electrodes of the conducting layer 218, the comb electrodes of the device layer 202c, the supporting base 202, the frame 204 and the movable body 206. The etching process stops until the insulation layer 202b is exposed. Because all the comb electrodes are formed by the same mask, the problem of conventional misalignment of the comb electrodes in the actuator can be solved. Furthermore, referring to FIG. 1B, the problem of improper lateral undercut 111 when the isotropic etching is employed in the device layer 110 can be solved.

In FIG. 9L, a fifth mask pattern 800e is deposited on the substrate 202a.

In FIG. 9M, the substrate 202a is etched to expose the insulation layer 202b based on the fifth mask pattern 800e, and the fifth mask layer is removed thereafter.

In FIG. 9N, the insulation layer 202b is etched to release the structures of the two-dimensional comb-drive actuator 200. The frame 204 and the movable body 206 are allowed to rotate freely around the first rotational axis 210a and the second rotational axis 210b, respectively.

In FIG. 9O, a metal layer is deposited on top of the device layer 202c for forming the reflective layer 226.

According to the previous descriptions, the present inventions provide a two-dimensional comb-drive actuator and the manufacturing method thereof for increasing the range of rotation angle and for easy initiation of rotation of the movable body and the frame through selectively deposited conducting layer on top of specific comb electrodes. The manufacturing procedure provides a mean of patterning the vertically stacked comb electrodes consisting of conducting layer on top of silicon in the same etching process; therefore, resolving the precision alignment problem commonly encountered in conventional manufacturing vertical comb drive actuators. The two-dimensional comb-drive actuator may be applied with electrical potential differences of specific waveforms such that the oscillation trajectory of the movable body can be controlled in either sinusoidal motion or raster scan motion.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A two-dimensional comb-drive actuator, comprising:
  a supporting base having two sets of first comb electrodes;
  a frame connected to the supporting base and having two sets of internal comb electrodes and two sets of external comb electrodes, for rotating around a first rotational axis wherein the two sets of external comb electrodes are interdigitated to the two sets of first comb electrodes correspondingly; and
  a movable body connected to the frame and having two sets of second comb electrodes, for rotating around a second rotational axis which is perpendicular to the first rotational axis and interdigitated to the two sets of internal comb electrodes wherein along a specific direction perpendicular to the first and second rotational axes, a conducting layer is coated on a surface of at least one of the two sets of internal comb electrodes and the two sets of second comb electrodes, and on a surface of at least one of the two sets of first comb electrodes and the two sets of external comb electrodes, so that a comb electrode thickness of combing the conducting layer and at least one of the two sets of internal comb electrodes and the two sets of second comb electrodes is unequal to a thickness of each of the others of the two sets of internal comb electrodes and the two sets of second comb electrodes in the specific direction, and a comb electrode thickness of combing the conducting layer and at least one of the two sets of first comb electrodes and the two sets of external comb electrodes is unequal to a thickness of each of the others of the two sets of first comb electrodes and the two sets of external comb electrodes in the specific direction.

2. The two-dimensional comb-drive actuator of claim 1, wherein the two sets of second comb electrodes are disposed on opposite sides of the second rotational axis, respectively.

3. The two-dimensional comb-drive actuator of claim 1, wherein a fixed electrical potential difference is applied between the two sets of second comb electrodes and the two sets of interdigitated internal comb electrodes for rotating the movable body around the second rotational axis either clockwise or counterclockwise.

4. The two-dimensional comb-drive actuator of claim 1, wherein an alternating electrical potential difference is applied between the two sets of second comb electrodes and the two sets of internal comb electrodes for rotating the movable body around the second rotational axis back and forth bi-directionally.

5. The two-dimensional comb-drive actuator of claim 1, wherein the supporting base further comprises a substrate, an insulation layer and a device layer which are vertically stacked, and the two sets of first comb electrodes are disposed on the device layer and in opposite sides of the first rotational axis, respectively.

6. The two-dimensional comb-drive actuator of claim 5, wherein at least one fixed electrical potential difference is applied between the two sets of external comb electrodes and the two sets of interdigitated first comb electrodes for rotating the frame around the first rotational axis either clockwise or counterclockwise.

7. The two-dimensional comb-drive actuator of claim 5, wherein at least one alternating electrical potential difference is applied between the two sets of external comb electrodes and the two sets of interdigitated first comb electrodes for rotating the frame around the first rotational axis back and forth bi-directionally.

8. The two-dimensional comb-drive actuator of claim 5, wherein the supporting base further comprises two sets of third comb electrodes disposed on the substrate and two sets of third comb electrodes are interdigitated to the two sets of external comb electrodes.

9. The two-dimensional comb-drive actuator of claim 8, wherein at least one fixed electrical potential difference is applied between the two sets of external comb electrodes of the conducting layer and the interdigitated two sets of third comb electrodes for rotating the frame around the first rotational axis either clockwise or counterclockwise, and when a top surface of the conducting layer starts to overlap with the top of the third comb electrodes, the frame has a maximum rotation angle, at least one second fixed electrical potential difference is applied between the two sets of external comb electrodes and the two sets of interdigitated first comb electrodes to inversely rotate the frame around the first rotational axis from the maximum rotation angle.

10. The two-dimensional comb-drive actuator of claim 8, wherein at least one alternating electrical potential difference is applied between the two sets of external comb electrodes of the conducting layer, the two sets of interdigitated first comb electrodes and the two sets of interdigitated third comb electrodes for rotating the frame around the first rotational axis back and forth bi-directionally.

11. The two-dimensional comb-drive actuator of claim 1, wherein the supporting base further comprises a substrate, an insulation layer and a device layer which are vertically stacked, and the two sets of first comb electrodes are disposed on the substrate and in opposite sides of the first rotational axis, respectively.

12. The two-dimensional comb-drive actuator of claim 11, wherein the two sets of external comb electrodes are vertically offset from the two sets of first comb electrodes, and the thickness of the two sets of external comb electrodes with conducting layer deposited is greater than the thickness of the device layer.

13. The two-dimensional comb-drive actuator of claim 11, wherein at least one fixed electrical potential difference is applied between the two sets of external comb electrodes with conducting layer deposited and the interdigitated two sets of first comb electrodes for rotating the frame around the first rotational axis either clockwise or counterclockwise, and when a top surface of the conducting layer starts to overlap with the top of the first comb electrodes, the frame has a maximum rotation angle.

14. The two-dimensional comb-drive actuator of claim 11, wherein at least one alternating electrical potential difference is applied between the two sets of external comb electrodes with the conducting layer deposited and the two sets of interdigitated first comb electrodes for rotating the frame around the first rotational axis back and forth bi-directionally.

15. The two-dimensional comb-drive actuator of claim 1, wherein the two sets of first comb electrodes are disposed in opposite sides of the first rotational axis, respectively.

16. The two-dimensional comb-drive actuator of claim 1, wherein the two sets of second comb electrodes are disposed in opposite sides of the second rotational axis, respectively.

17. The two-dimensional comb-drive actuator of claim 1, wherein a fixed electrical potential difference is applied between the two sets of second comb electrodes and the two sets of interdigitated internal comb electrodes for rotating the movable body around the second rotational axis either clockwise or counterclockwise.

18. The two-dimensional comb-drive actuator of claim 1, wherein an alternating electrical potential difference is applied between the two sets of second comb electrodes and the two sets of internal comb electrodes for rotating the movable body around the second rotational axis back and forth bi-directionally.

19. The two-dimensional comb-drive actuator of claim 1, wherein at least one fixed electrical potential difference is applied between the two sets of external comb electrodes and the two sets of interdigitated first comb electrodes for rotating the frame around the first rotational axis either clockwise or counterclockwise.

20. The two-dimensional comb-drive actuator of claim 1, wherein at least one alternating electrical potential difference is applied between the two sets of external comb electrodes and the two sets of interdigitated first comb electrodes for rotating the frame around the first rotational axis back and forth bi-directionally.

21. The two-dimensional comb-drive actuator of claim 1, further comprising a reinforced structure disposed on top of the movable body.

22. The two-dimensional comb-drive actuator of claim 1, further comprising a reflective layer on the bottom of the movable body.

23. The two-dimensional comb-drive actuator of claim 1, further comprising a plurality of contact areas disposed on top of the supporting base.

* * * * *